(12) United States Patent
Kaviani

(10) Patent No.: US 6,838,918 B1
(45) Date of Patent: Jan. 4, 2005

(54) HARD PHASE ALIGNMENT OF CLOCK SIGNALS USING ASYNCHRONOUS LEVEL-MODE STATE MACHINE

(75) Inventor: Alireza S. Kaviani, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 72 days.

(21) Appl. No.: 10/300,446

(22) Filed: Nov. 19, 2002

(51) Int. Cl.[7] .................................... H03L 7/00
(52) U.S. Cl. ............................. 327/160; 327/159
(58) Field of Search ..................... 327/141, 146–151, 327/154–160, 163; 331/DIG. 2, 17; 332/127; 375/374–376

(56) References Cited

U.S. PATENT DOCUMENTS

| | | | |
|---|---|---|---|
| 5,334,952 A | * | 8/1994 | Maddy et al. ............... 331/1 A |
| 5,907,263 A | * | 5/1999 | Divine et al. ................ 331/16 |
| 5,942,949 A | * | 8/1999 | Wilson et al. ............... 331/17 |
| 6,043,717 A | * | 3/2000 | Kurd ........................... 331/17 |
| 6,107,826 A | | 8/2000 | Young et al. |
| 6,191,613 B1 | | 2/2001 | Schultz et al. |
| 6,204,710 B1 | | 3/2001 | Goetting et al. |
| 6,255,880 B1 | | 7/2001 | Nguyen |
| 6,289,068 B1 | | 9/2001 | Hassoun et al. |
| 6,356,160 B1 | | 3/2002 | Robinson et al. |
| 6,373,308 B1 | | 4/2002 | Nguyen |
| 6,384,647 B1 | | 5/2002 | Logue |
| 6,400,734 B1 | | 6/2002 | Weigand |
| 6,473,478 B1 | * | 10/2002 | Wallberg et al. ............ 375/376 |

OTHER PUBLICATIONS

U.S. patent application Ser. No. 09/684,529, Logue et al., filed Oct. 6, 2000.

* cited by examiner

*Primary Examiner*—My-Trang Nuton
(74) *Attorney, Agent, or Firm*—Edel M. Young; W. Eric Webostad; Justin Liu

(57) ABSTRACT

A frequency synthesizer for a programmable logic device includes a phase alignment circuit that is controlled by an asynchronous level-mode state machine. The state machine receives a start signal generated by the circuits that determine a concurrence cycle when reference and generated clock signals should be aligned. Then, at the concurrence cycle the state machine replaces a generated clock edge with a reference clock edge to bring the generated clock signal into hard phase alignment with the reference clock signal.

12 Claims, 20 Drawing Sheets

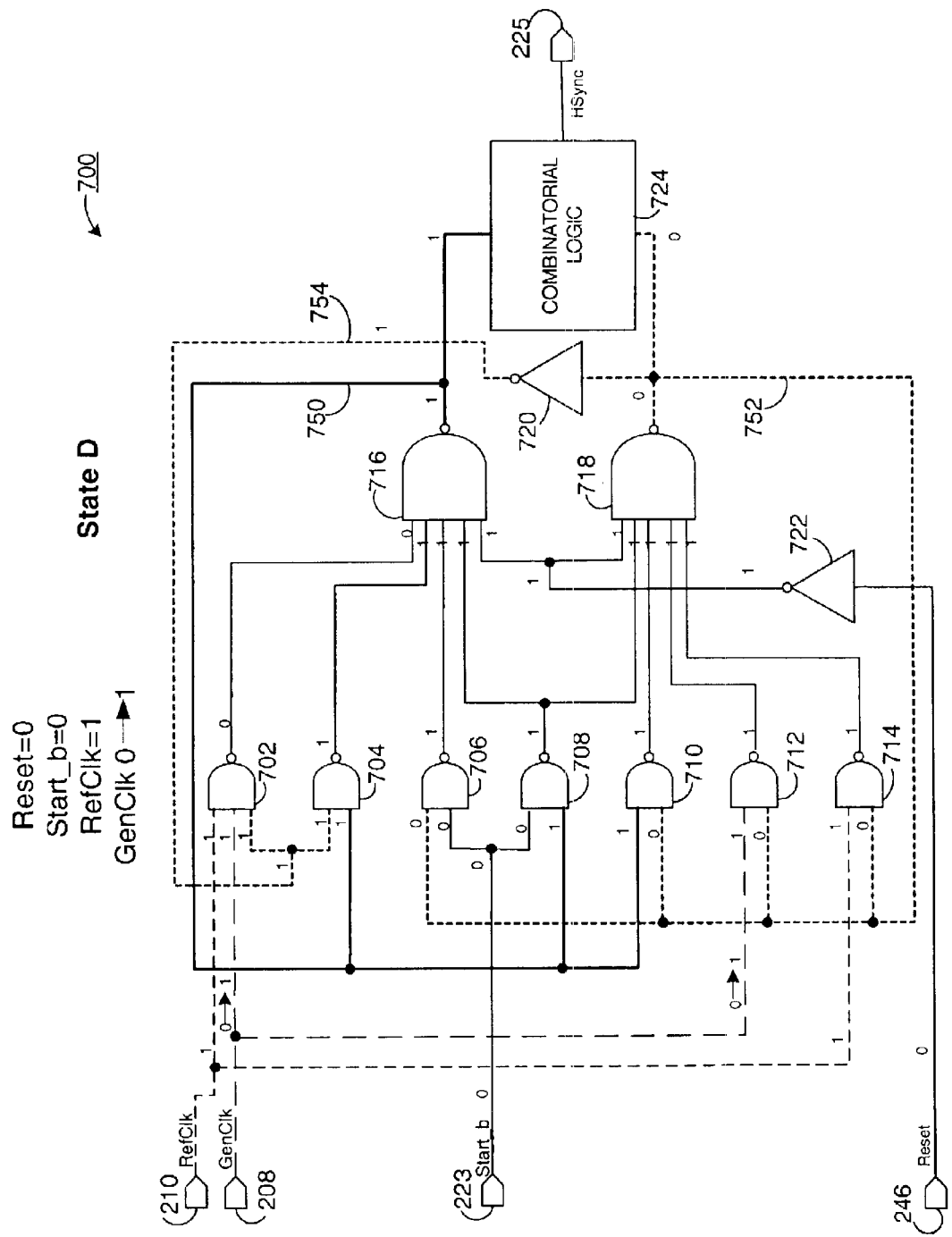

HARD PHASE ALIGNMENT OF CLOCK SIGNALS USING ASYNCHRONOUS LEVEL-MODE STATE MACHINE

FIELD OF THE INVENTION

The present invention relates generally to digital frequency synthesis and more particularly to phase alignment of clock signals used with digital frequency synthesis systems.

BACKGROUND OF THE INVENTION

A programmable logic device (PLD) is a well-known type of integrated circuit (IC) that may be programmed by a user to perform specified logic functions. Conventionally, a PLD receives one or more external reference clock signals to generate one or more internal clock signals to operate internal digital circuits. Clock management circuits control timing of various clock signals in the PLD or other integrated circuit device.

When a clock signal propagates through an integrated circuit device, the clock signal can become skewed (delayed) so that signals in one part of the device that were generated from the skewed clock signal are out of phase with signals generated in another part of the device. Clock skew is caused by various factors, such as capacitive and resistive loading on the clock line, causing propagation delay. Clock management circuits can compensate for skewing of a clock signal as the clock signal propagates within or between IC devices.

Clock management circuits can also perform digital frequency synthesis in which a clock signal is generated whose frequency is the frequency of a reference clock signal multiplied by a rational number. For example, the generated clock signal may have a frequency 7/5 of the reference clock frequency. It is important for proper operation of circuits in the integrated circuit device that a generated clock signal be maintained accurately at the specified phase and frequency. This is often done by assuring that the phase of the generated clock signal coincide with that of the reference clock signal when concurrence should occur. For example, if the generated clock frequency is 7/5 of the reference clock frequency, then every 7 cycles of the generated clock signal and every 5 cycles of the reference clock signal, the two clock edges should be in concurrence.

Phase locked loops and delay locked loops compensate for clock skew, bringing the phase of a clock signal in one part of the device into alignment with the clock signal in another part of the device. Delay locked loops use a delay line to manage the propagation delay of the clock signals. Delay lines typically comprise a number of delay elements whose delay may be controlled by controlling either a voltage or the number of delay elements. If the total delay of the delay line is controlled by adjusting the total number of delay elements on the clock path, the delay line may be referred to as a tap-controlled delay line, where taps are taken from the delay line between each of the delay elements.

Due to their relative simplicity, oscillators are sometimes constructed in integrated circuits by feeding back the output of the delay line to its input after an inversion. If the delay line in the oscillator is voltage-controlled, analog circuits adjust the frequency by adjusting the voltage applied to the delay line (voltage controlled oscillators). In an oscillator based on a tap-controlled delay line, the number of delay elements in a delay line is used to control the frequency.

Young and Bauer in U.S. Pat. No. 6,107,826; Hassoun, Goetting and Logue in U.S. Pat. No. 6,289,068; Robinson, Grung, and Chen in U.S. Pat. No. 6,356,160; and Nguyen in U.S. Pat. Nos. 6,255,880 and 6,373,308 describe clock management structures, and these patents are incorporated herein by reference. Logue, Percey, and Goetting in U.S. patent application Ser. No. 09/684,529 describe a "Synchronized Multi-Output Digital Clock Manager" that uses a delay lock loop and digital frequency synthesis for clock signal management. This patent application is also incorporated herein by reference.

Young, Logue, Percey, Goetting, and Ching in U.S. patent application Ser. No. 09/684,540 describe a "Digital Phase Shifter", also incorporated herein by reference.

Logue in U.S. Pat. No. 6,384,647 describes a "Digital Clock Multiplier and Divider with Synchronization During Concurrences", also incorporated herein by reference. FIG. 3b of that patent is presented here as FIG. 1.

FIG. 1 herein shows the effect of hard phase alignment. A clock output signal C_O_CLK is generated from a reference clock signal REF_CLK. This generated clock signal C_O_CLK has approximately the desired frequency. In the example of FIG. 1, REF_CLK has a period of 50 units of time. The generated clock signal is four times as fast as the reference clock signal and thus should have a period of 12.50 units of time. But the generated clock signal C_O_CLK actually has a period of only 12 units of time. Therefore C_O_CLK becomes out of phase with REF_CLK. Thus, in a window W when concurrence should occur, instead of continuing to generate C_O_CLK, the generated clock signal is adjusted using the edge of REF_CLK, so C_O_CLK is again synchronized with REF_CLK. This method of synchronizing to the REF_CLK signal is called hard phase alignment.

A phenomenon called jitter randomly causes clock edges to become advanced or retarded. Jitter occurs even to the reference clock signal. Thus, it is difficult to align a generated clock signal to a reference clock signal when both have jitter. If a window is used, and jitter places an edge beyond the window, the clock management circuit may be unable to maintain the synchronization of a generated clock signal to a reference clock signal.

In an IC such as an FPGA in which a wide range of clock frequencies must be offered, the window must be a different size for different user-selected operating frequencies. Typically, the user must specify the window placement during programming of the FPGA. Also, if it is desired to make all generated clock pulses of nearly equal width (reduce jitter), it is necessary to provide a wide range of delays in order to better adjust the generated clock signal continuously, which requires enough chip area to accommodate many delay circuits. Still, the window for alignment must be pre-calculated, and if jitter is too great, the reference clock edge will not arrive during the window, and alignment will not occur. In one circuit, the generated clock signal stopped oscillating in the presence of high jitter, an unacceptable result. Thus there is a need for a phase alignment circuit and method that generates a reliable clock signal in the presence of high jitter and high clock skew. It would be desirable, also, to achieve this result in a small chip area. It is also desirable that the phase alignment circuit contribute a small amount of internal IC noise due to its own switching.

SUMMARY OF THE INVENTION

According to the invention, an asynchronous level-mode state machine controls phase alignment between a reference input clock signal and a generated clock signal at a time when the two should be aligned, and does not require a pre-set window. Hard phase alignment of the generated clock signal to a reference clock signal is performed when concurrence should occur. As used herein, an asynchronous level-mode state machine is asynchronously responsive to level changes in one or more input signals. That is, an output of an asynchronous level-mode state machine may change state in response to any level change in an input signal.

As a benefit to the invention, there is no requirement to specify a clock window based on the user's intended clock frequency. The window is determined by the signals themselves. Based on the user's intended clock frequency and the frequency of the reference clock signal, counters determine when concurrence of these two signals should occur, and hard phase alignment is performed at that time. The state machine receives a start signal controlled by counters counting reference and generated clock pulses. The start signal indicates that the reference and generated clock signals should be coming into concurrence and hard phase alignment should occur. (The state machine may also receive a Reset signal.)

In one embodiment, the state machine has four states. State A is a resting state in which the generated clock signal runs normally and the state machine is waiting for the time the reference and generated clock signals should be in concurrence. The state machine remains in state A until the start signal is received (and it returns to state A if a Reset signal is received, if present). An active start signal (in one embodiment, the active start signal is a low Start_b signal) indicates that counters have counted a number of cycles for which concurrence of the reference and generated clock signals should occur, and causes the state machine to go to State B, in which the state machine checks for concurrence of the reference and generated clock signals. In an embodiment described here, the state machine looks for both reference and generated clock signals to be low together. In another embodiment, the state machine can look for both to be high together. When both have gone low, the state machine moves to State C, where the generated clock signal edge is replaced by that of the reference clock signal, thus performing hard phase alignment. When both the reference and the generated clock signals go high, the state machine moves to State D, no longer performing hard phase alignment. In state D the state machine waits for the start signal to end, which occurs when the reference and generated clock signals no longer concur. When the start signal ends, the process of hard phase alignment ends, and the generated clock signal continues to be generated normally.

Asserting hard phase alignment means that the phase of the generated clock signal is brought into alignment with the phase of the reference clock signal. So if there is any phase difference between the generated clock signal and the reference clock signal, a period of the generated clock signal is shortened or lengthened in order to bring the edges of the reference clock and generated clock back into perfect phase alignment.

BRIEF DESCRIPTION OF THE DRAWINGS

FIGS. 7A through 7H show signal values at nodes in the circuit of FIG. 7 for different states of the state machine.

DETAILED DESCRIPTION OF THE DRAWINGS

Figure 2:
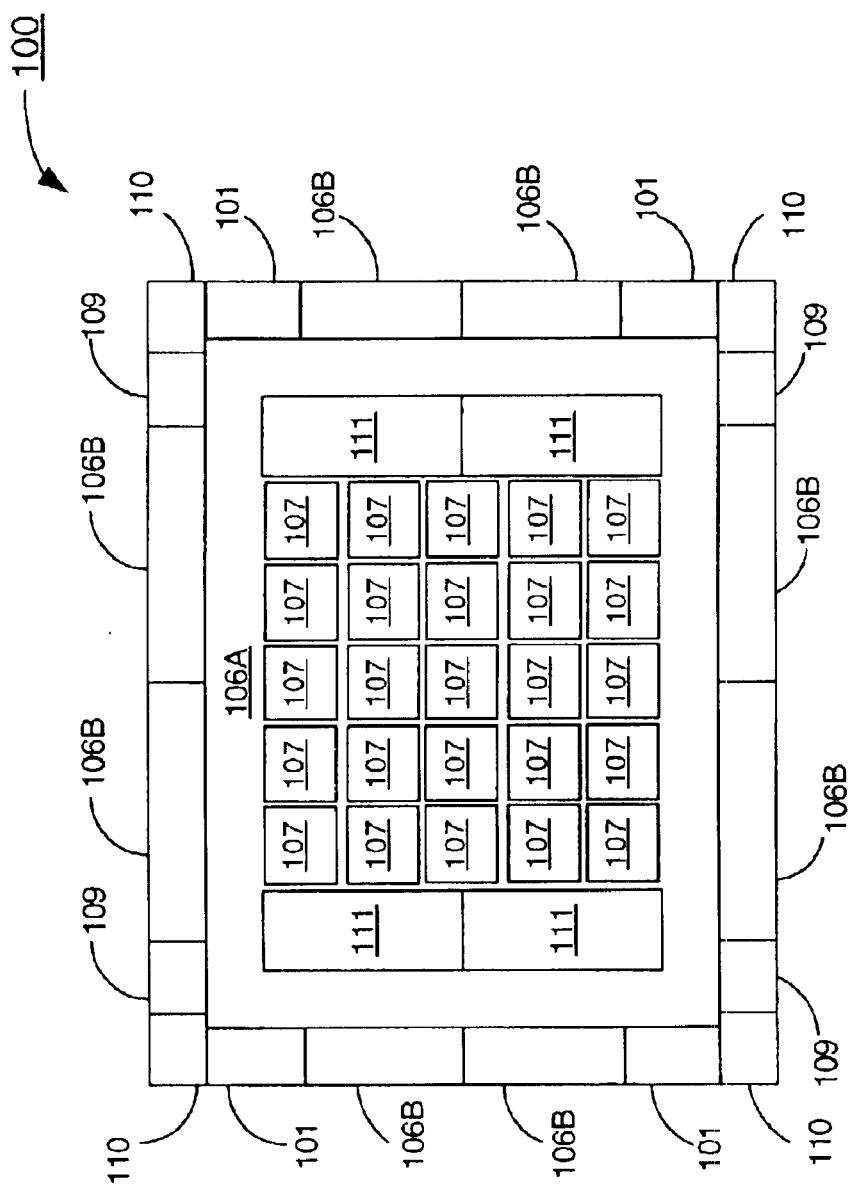
FIG. 2 is a block diagram of an FPGA that implements the present invention.

FIG. 2 shows FPGA 100, which includes CLBs 107, I/O routing ring 106A, memory 111, delay lock loops (DLLs) 109, multiply/divide/de-skew clock circuits 110, and programmable input/output blocks (IOBs) 106B. DLLs 109 and multiply/divide/de-skew clock circuits 110 collectively implement digital clock management circuits (DCMs). FPGA 100 also includes frequency synthesis circuits 101. Such an FPGA can implement the present invention. FPGA 100 benefits from the phase synchronizer of the present invention by generating a clock signal of a frequency selected by a user and reliably synchronized to a reference clock signal, typically having a frequency different from that selected by a user.

Figure 3:
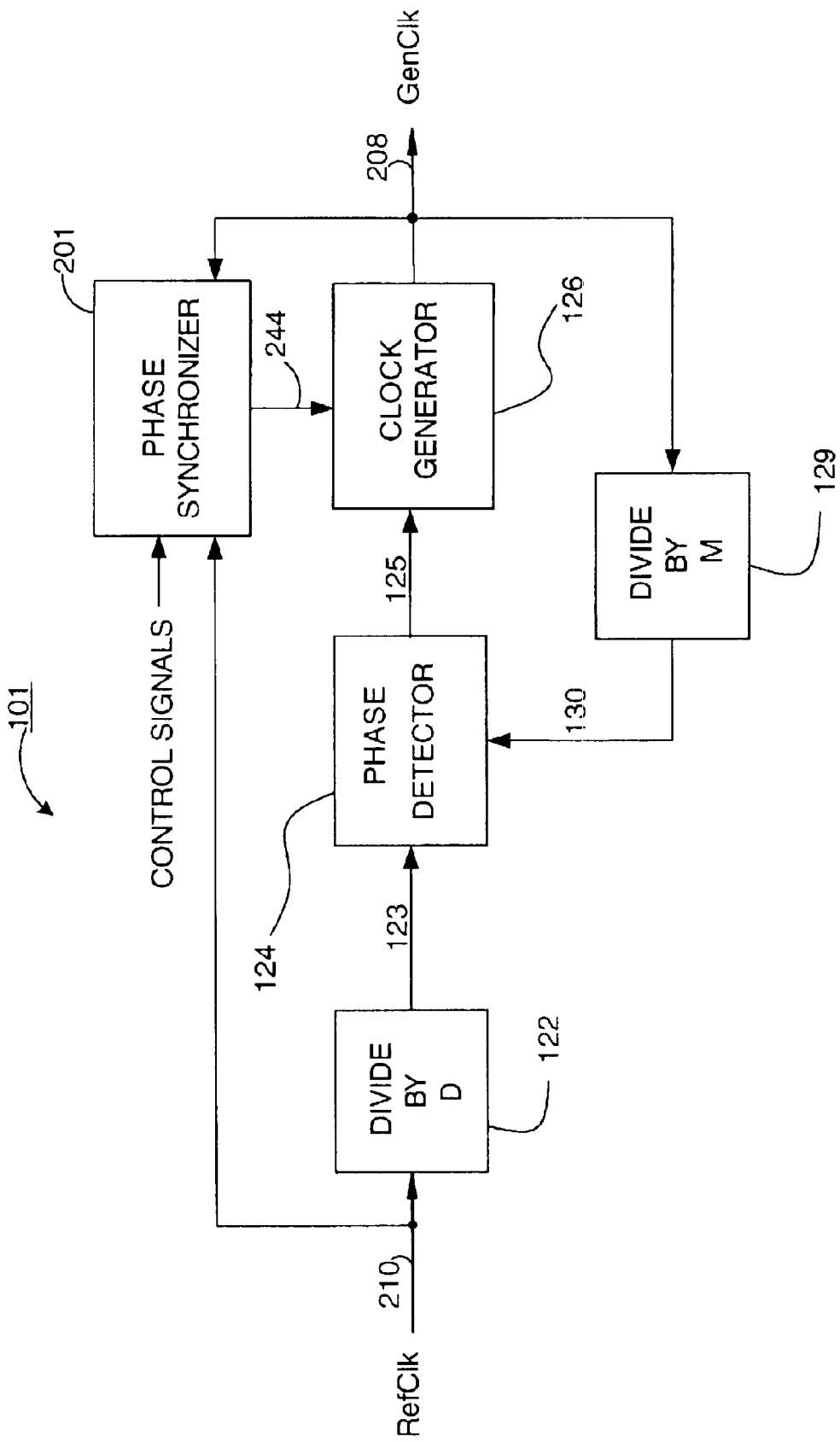
FIG. 3 shows a frequency synthesis circuit where the present invention may be used.

FIG. 3 shows a block diagram of a circuit for generating a generated clock signal GenClk having a ratio M/D to a reference input clock signal RefClk. The generated clock signal GenClk is generated by clock generator 126 in response to a phase detector 124 and a phase synchronizer 201. In order to generate the desired clock frequency GenClk, reference clock signal RefClk on line 210 is applied to Divide-by-D circuit 122. Well known circuits can be used to perform this divide function. An output signal 123 of Divide-by-D circuit 122 is received by phase detector 124 which also receives a divide-by-M signal on line 130 and causes clock generator 126 to generate an output signal GenClk that is M/D times RefClk.

Phase detector 124 provides a phase detection signal on line 125 to clock generator circuit 126, which generates clock signal GenClk on line 208. This output signal GenClk is applied to Divide-by-M circuit 129, which generates a divided signal applied on line 130 to phase detector 124. Phase detector 124 compares its two input signals on lines 123 and 130 and applies a signal on line 125 that guides clock generator 126 to adjust the frequency of the generated clock signal GenClk toward the desired frequency. The desired frequency can be achieved by feeding back a delayed clock signal from clock generator 126 through an inverter to phase synchronizer 201 to form an oscillator. The amount of delay determines the frequency of the oscillator. When the frequency is not quite right, it is adjusted by modifying the taps in the direction dictated by the phase detector 124. Phase detector 124 is discussed in detail in connection with FIGS. 9–12 below.

In one embodiment, clock generator 126 is a tapped delay line having 256 serially arranged coarse delay elements from which an intermediate signal may be tapped and eight parallel fine delay elements into which the intermediate signal may be applied. The GenClk signal of the clock generator on line 208 is taken from one of the fine delay elements. An oscillator is formed by inverting and feeding the GenClk signal on line 208 back through phase synchronizer 201. The oscillator frequency is determined by the selected taps in the clock generator 126, but even with coarse and fine selection of the delays, clock generator will not maintain a precise frequency without some correction.

Clock generator 126 may be formed as described by Logue in U.S. Pat. No. 6,384,647. FIG. 2a of that patent shows a structure having an initialization circuit 250, a halt/restart circuit 245, an oscillator control circuit 260, and a variable digital oscillator 270. These structures are described in detail by Logue, and may be used to implement clock generator 126 described here.

Clock generator 126 is controlled by both phase detector 125 and phase synchronizer 201. Phase synchronizer 201 periodically replaces the generated clock signal GenClk as it oscillates through phase synchronizer 201 with the reference clock signal RefClk received on line 210, in order to perform hard phase alignment.

Phase synchronizer 201 will now be discussed in detail.

Figure 4:
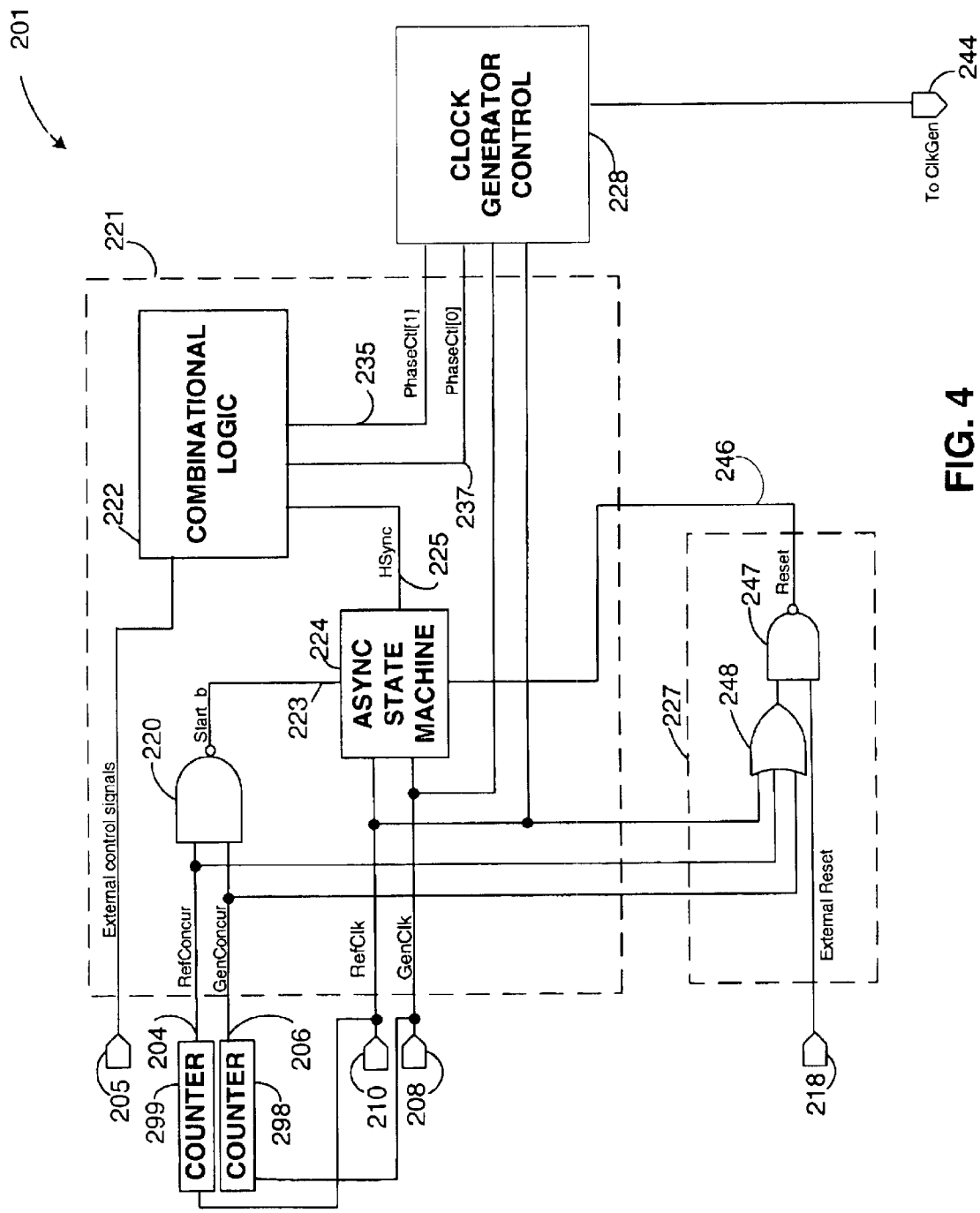
FIG. 4 shows a phase synchronizer circuit according to the present invention.

FIG. 4 shows an embodiment of phase synchronizer 201. Counter 299 receives RefClk signal on line 210, and counter 298 receives GenClk signal on line 208. In addition to receiving the reference clock signal RefClk on line 210 and the generated clock signal GenClk on line 208, phase synchronizer 201 also respectively receives counter 299 and counter 298 output signals RefConcur on line 204 and GenConcur on line 206 indicating when the reference and generated signals have oscillated D and M times respectively, which is when the RefClk and GenClk signals should be in concurrence. Accordingly, counters 299 and 298 count to D and M respectively. Phase synchronizer 201 also receives a global external reset signal on line 218 and other external control signals on lines 205.

Circuit 227 generates a high internal reset signal on line 246 either when the external reset signal goes low, or when OR gate 248 indicates that both RefConcur and GenConcur have gone low and that RefClk has also gone low. This internal reset signal assures that asynchronous state machine 224 begins in its initial state before each concurrence cycle. In another embodiment, circuit 227 can be omitted; nevertheless, circuit 227 increases the reliability of the state machine 224 in the presence of excessive noise.

Asynchronous state machine 224 generates the hard synchronization signal HSync on line 225. This HSync signal may be applied directly as a phase control signal to clock generator control circuit 228 or modified as shown in FIG. 4 by combinational logic 222 to generate phase control signals only under conditions controlled by external control signals on lines 205. For example, combinational logic 222 may comprise gates for generating PhaseCtl[1] and PhaseCtl[0] as functions of HSync on line 225, a halt signal, and other control signals specific to one embodiment of the invention. In this embodiment PhaseCtl[1] may simply be the inverse of the halt signal, and only asserted before the phase synthesizer 201 is tracking the phase or locked. PhaseCtl[0] may be the AND of the reference clock and PhaseCtl[1] before tracking the phase has started and may be the same as HSync after the system is tracking the phase or locked. Clock generator control circuit 228 generates the clock generator control signal on line 244 that is applied to clock generator 126 of FIG. 3 to control hard phase alignment. Asynchronous state machine 224 achieves the improvement over prior art structures such as that described by Logue in U.S. Pat. No. 6,384,647 by using an internally generated start signal to activate the alignment window. The start signal avoids having a pre-set window for hard phase alignment.

Figure 5:
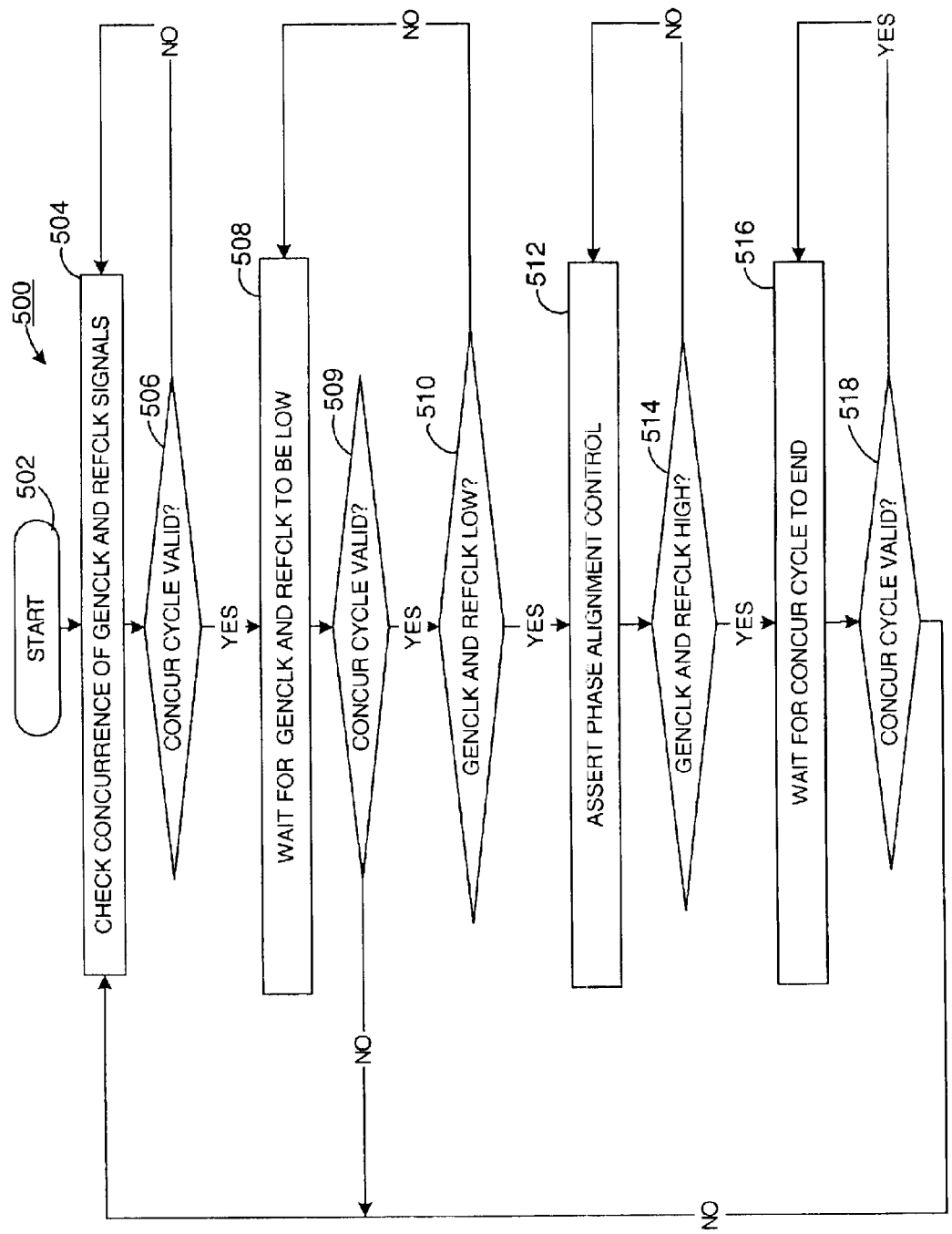
FIG. 5 is a flow diagram showing the operation of an asynchronous level-mode state machine used in the circuit of FIG. 4.

FIG. 5 shows a flow chart implemented by asynchronous state machine 224. Phase alignment method 500 moves to step 502 in response to a valid (active) Start_b signal. At 504, concurrence of generated clock signal 208 and reference clock signal 210 is checked. At 506, if concurrence is not present, then phase alignment method 500 returns to 504. However if at 506, concurrence is present (RefClk and GenClk have the same logic value), then at 508 phase alignment method 500 waits for generated clock signal 208 and reference clock signal 210 to be logic low. At 509, concurrence between generated clock signal 208 and reference clock signal 210 is again checked. If at 509 generated clock signal 208 and reference clock signal 210 are not in concurrence, then phase alignment method 500 returns to 504. If however at 509, generated clock signal 208 and reference clock signal 210 are in concurrence, the method continues to 510. If at 510, generated clock signal 208 and reference clock signal 210 are not both logic low, then phase alignment method 500 returns to 508. If however at 510 generated clock signal 208 and reference clock signal 210 are both logic low, then at 512, phase alignment method 500 asserts the phase alignment control signal, e.g., phase alignment signal 225 (see FIGS. 3 and 4), to hard phase align the generated clock signal on line 208 to the reference clock signal on line 210. This alignment occurs as the reference clock signal RefClk on line 210 goes high. At 514, logic levels of generated clock signal 208 and reference clock signal 210 are compared. If at 514, generated clock signal GenClk on 20B and reference clock signal RefClk on 210 are not both logic high, then phase alignment method 500 returns to 512. However, if generated clock signal 208 and reference clock signal 210 are both logic high, then at step 516 phase alignment method 500 waits for concurrence between generated clock signal 208 and reference clock signal 210 to end. If at 518, the Start_b signal is still active, then method 500 returns to 516. However, if at 518 the Start_b signal becomes inactive indicating concurrence of generated clock signal 208 and reference clock signal 210 is ended, then phase alignment method 500 returns to 504 and waits for the next concurrence.

Figure 6:
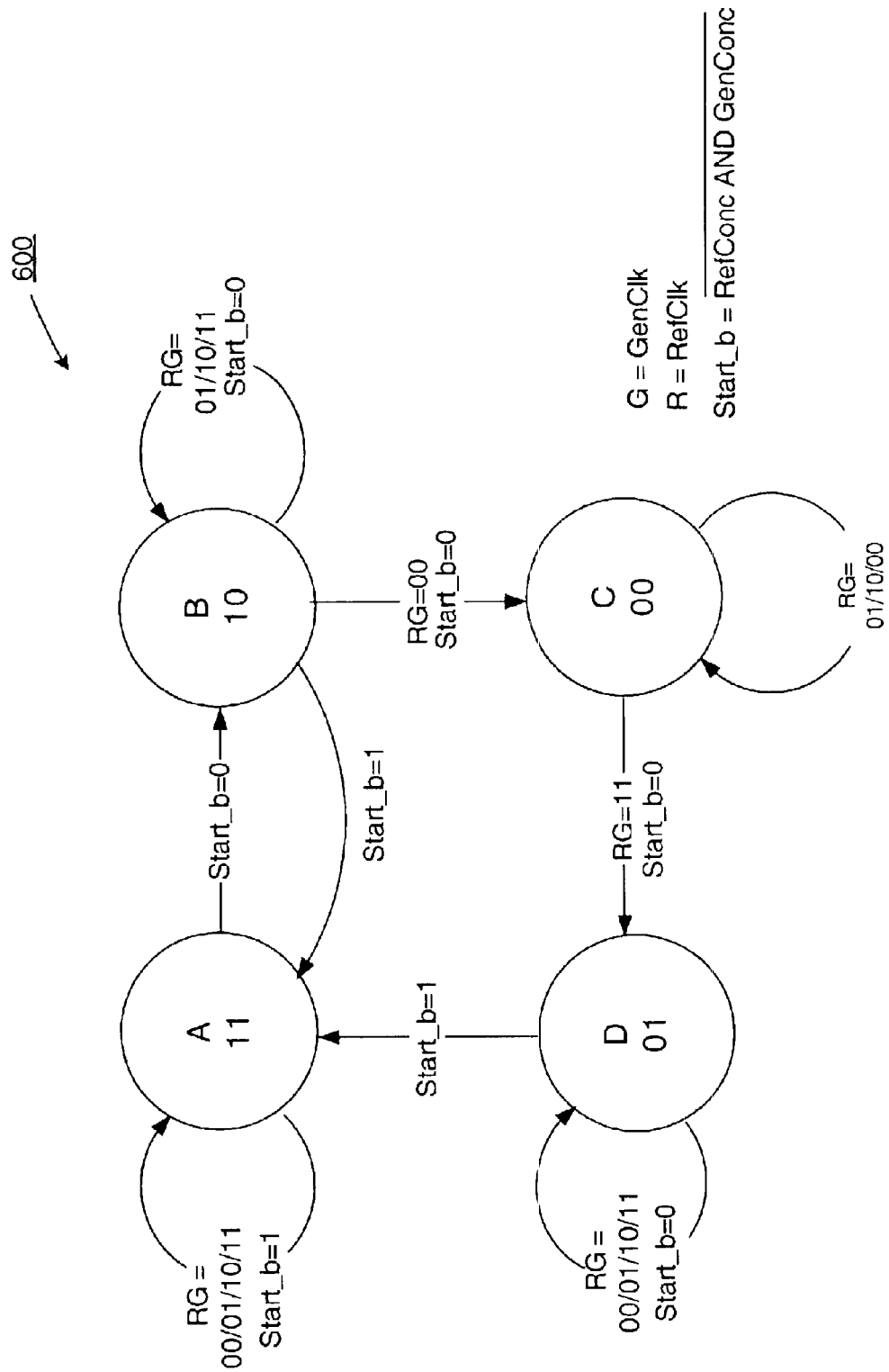
FIG. 6 shows a state diagram for the asynchronous level-mode state machine used in the circuit of FIG. 4.

FIG. 6 shows a state diagram for the asynchronous state machine 224 of FIG. 4 or FIG. 5. The state machine has four states A, B, C, and D. State A occurs when RefClk and GenClk are not expected to be in concurrence. In state A, the Start_b signal is inactive (logic high in this embodiment). When Start_b goes low, the state machine moves to state B, where the states of RefClk and GenClk are checked. In FIG. 6, R stands for RefClk and G stands for GenClk. As shown in FIG. 6, as long as either of RefClk or GenClk are logic 1 (high) and the Start_b signal remains active (logic 0), the state machine waits in state B. When both RefClk and GenClk go low, if Start_b is still active (low), the state machine moves to state C, where hard phase alignment is performed. This alignment occurs when the edge of RefClk goes high.

When both of RefClk and GenClk have gone high (which means hard phase alignment has been achieved successfully), the state machine moves to state D, where it remains until the Start_b signal goes inactive (high) indicating concurrence is ended. State machine 600 then returns to state A to wait for another concurrence between edges of RefClk and GenClk, at which time hard phase alignment is repeated.

Figure 7:
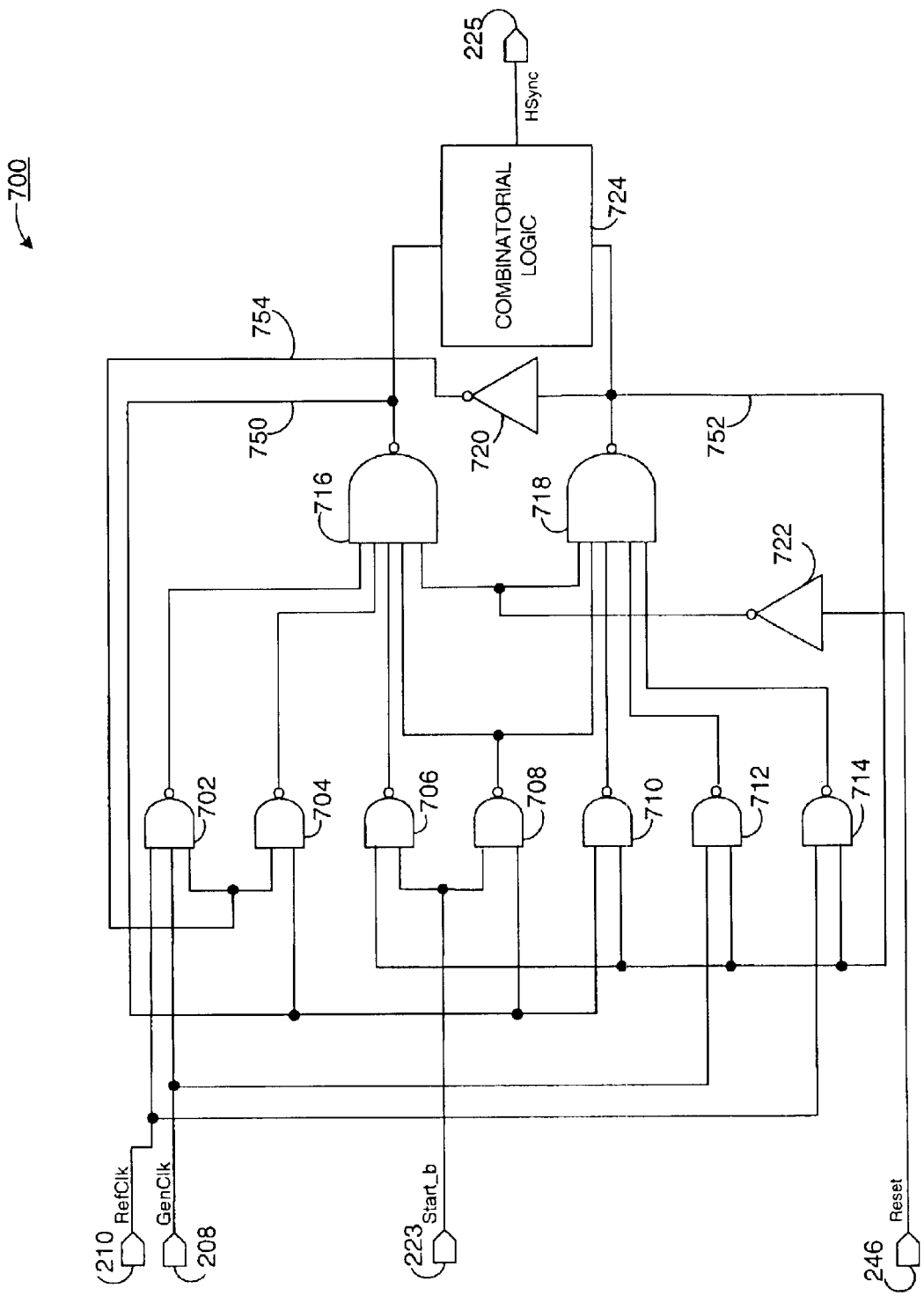
FIG. 7 shows an exemplary circuit diagram for the asynchronous level-mode state machine used in the circuit of FIG. 3.

FIG. 7 shows a circuit that can implement the flow of FIG. 5 or the state machine of FIG. 6. The circuit of FIG. 7 uses NAND gates. As will be understood by one of ordinary skill in the art, many other circuits can also implement the state machine of FIGS. 5 and 6, using AND gates, OR gates, or a combination of gates, as long as the intended asynchronous logic is implemented whereby hard phase alignment occurs when concurrence is expected and the logic level and clock edge of the reference signal are appropriate for replacing the logic level and clock edge of the generated clock signal.

The circuit of FIG. 7 includes two feedback paths and thus implements a storage circuit having four possible states with four combinations of two output signals. This circuit receives four input signals, an optional global Reset signal, the Start_b signal, the RefClk signal, and the GenClk signal. Eight versions of FIG. 7, labeled 7A–7H are presented, with values on lines of the circuit for showing the operation of this circuit.

Figure 7A:
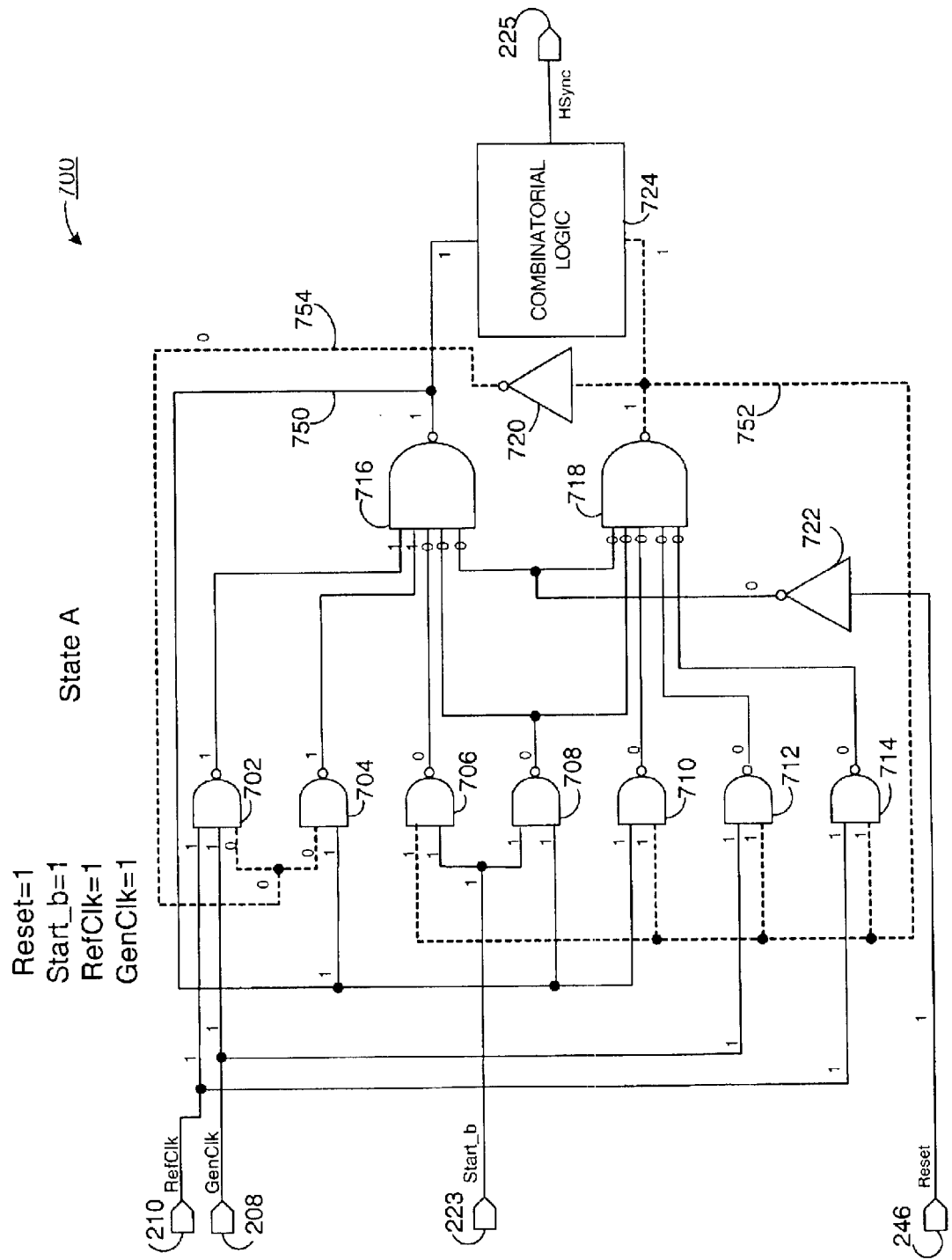

In FIG. 7A, the Reset signal is active, causing NAND gates 716 and 718 to provide logic 1 output signals regardless of the states of other input signals. Combinational logic circuit 724 receives two logic 1 input signals and therefore does not provide an active HSync output signal on line 225. In one embodiment the circuit 724 can be a simple 2-input NAND gate.

Figure 7B:
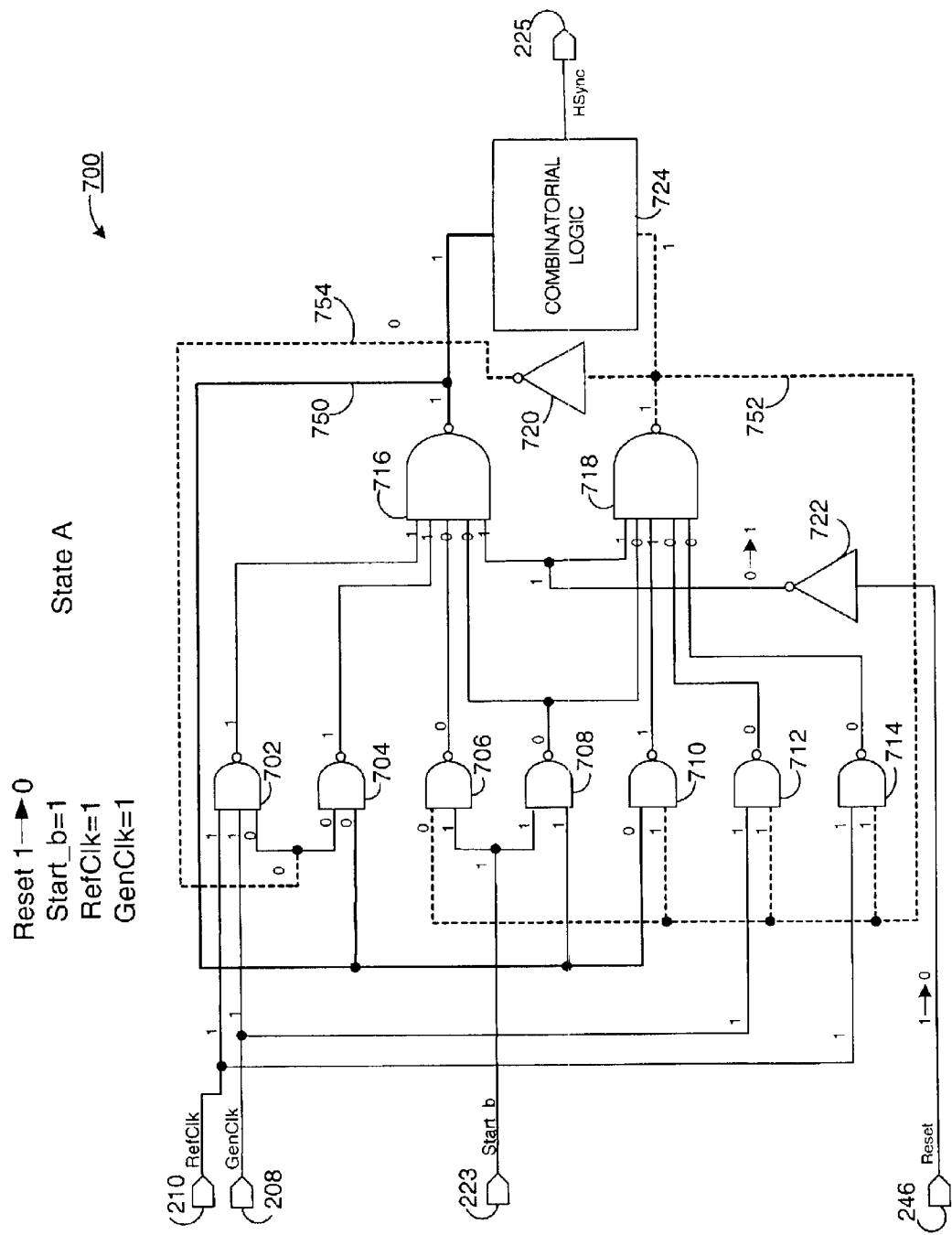

FIG. 7B shows a situation in which Reset has gone inactive (low) and the Start_b signal is still inactive. NAND gate 716 receives low input signals from NAND gates 706 and 708 (controlled by the Start_b signal) and thus continues to provide a logic 1 output signal. NAND gate 718 also receives a low input signal from NAND gate 708 and in this example also from NAND gates 712 and 714 which in the example of FIG. 7B reflect the high signals from RefClk and GenClk. Therefore, NAND gate 718 provides a logic 1 output signal. Thus, circuit 724 again receives two logic 1 input signals and does not provide an active HSync output signal on line 225.

Figure 7C:
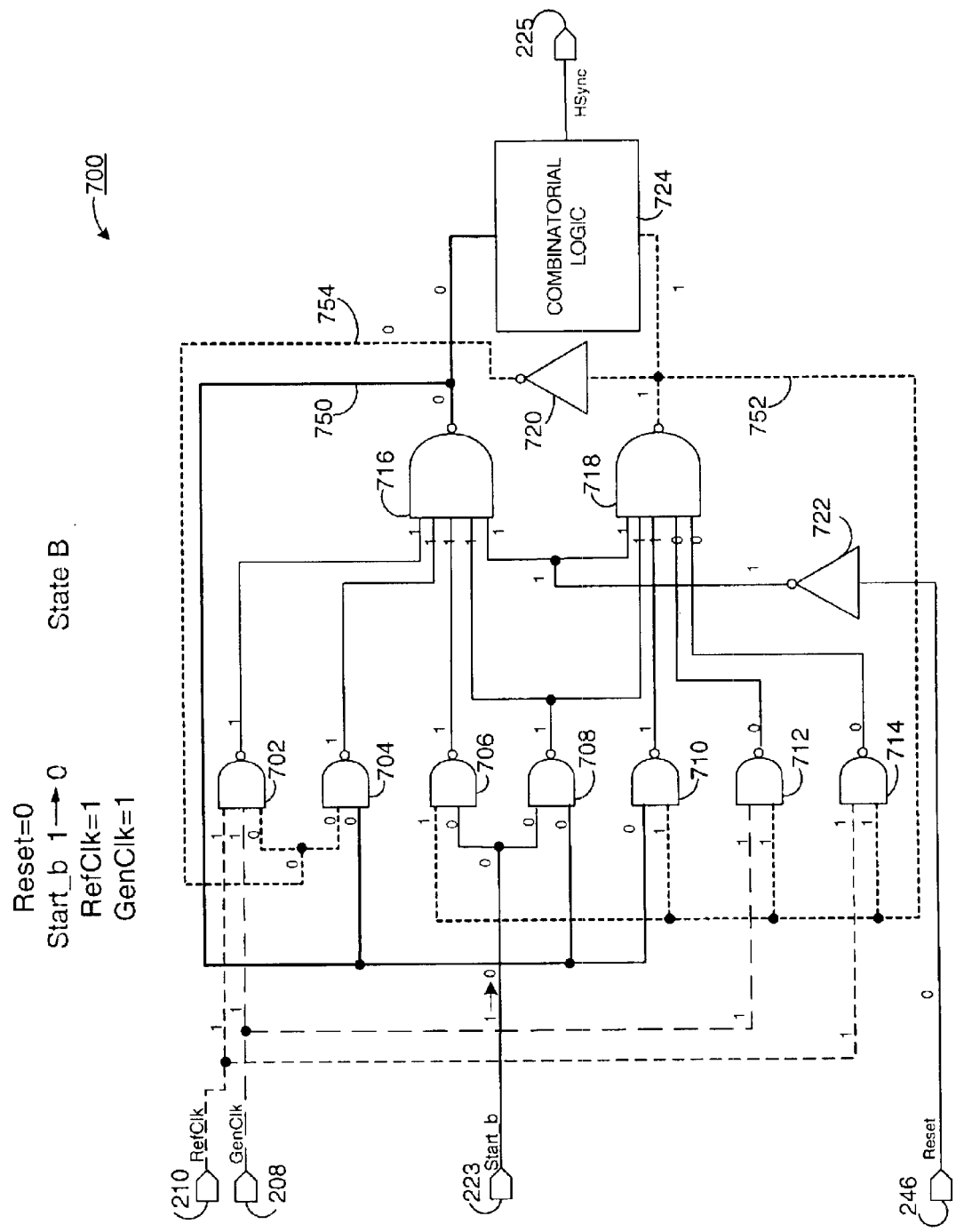

In FIG. 7C, the Start_b signal has become active (low). This causes NAND gates 706 and 708 to provide high output signals. Since NAND gate 718 continues to receive low signals from NAND gates 712 and 714 due to the high RefClk and GenClk signals, NAND gate 718 continues to provide a high output signal. But since NAND gate 716 now receives all high input signals, NAND gate 716 provides a low signal to circuit 724. If combinatorial logic circuit 724 is a NAND gate, it continues not providing an active HSync output signal on line 225.

Figure 7D:
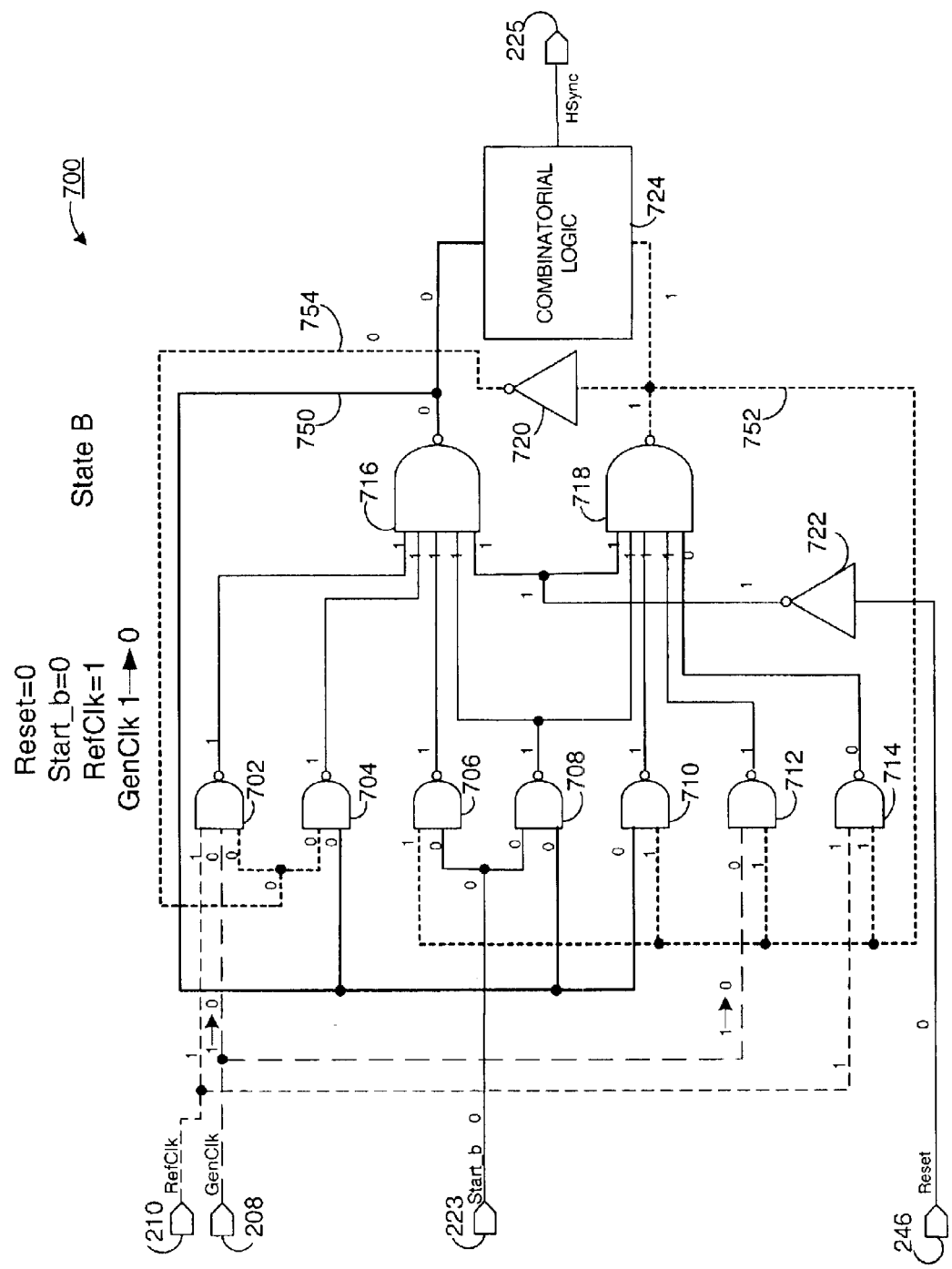

In FIG. 7D, the GenClk signal goes low but RefClk remains high. This causes NAND gate 712 to output a high signal to NAND gate 718 but does not change the state of NAND gate 718 because NAND gate 714 is still providing a low input signal. Thus the state machine remains in State B and combinatorial circuit 724 continues not providing an active HSync output signal on line 225.

Figure 7E:
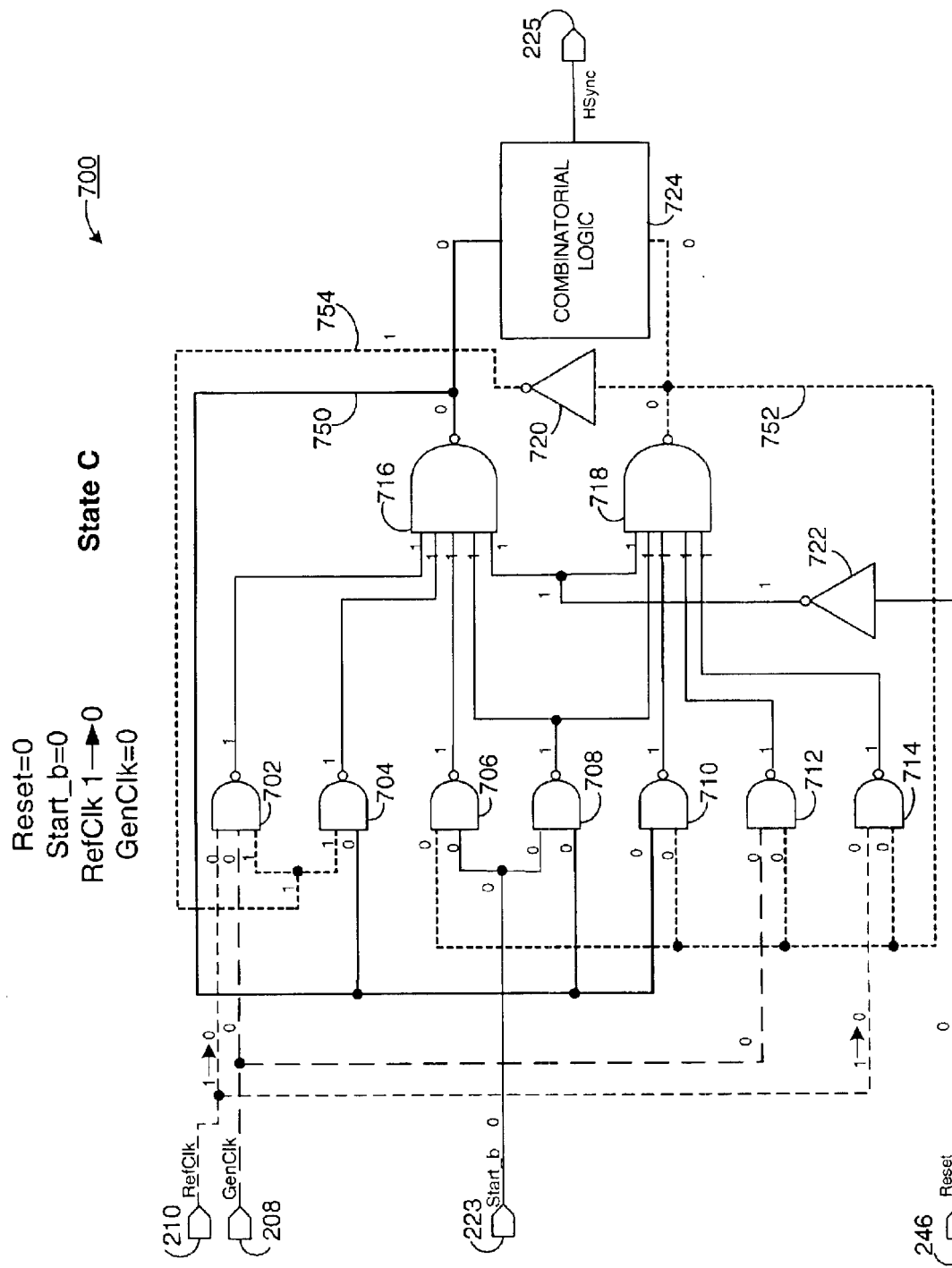

In FIG. 7E, the RefClk signal goes low. This does not change the output of NAND gate 702 so all inputs to NAND gate 716 remain high and NAND gate 716 continues to output a logic 0 to combinatorial logic circuit 724. But NAND gate 714 now provides a high signal to NAND gate 718 so NAND gate 718 outputs a low signal to combinatorial logic circuit 724. If combinatorial circuit 724 is a NAND gate, the two low input signals cause circuit 724 to output an active HSync output signal on line 225.

Figure 7F:
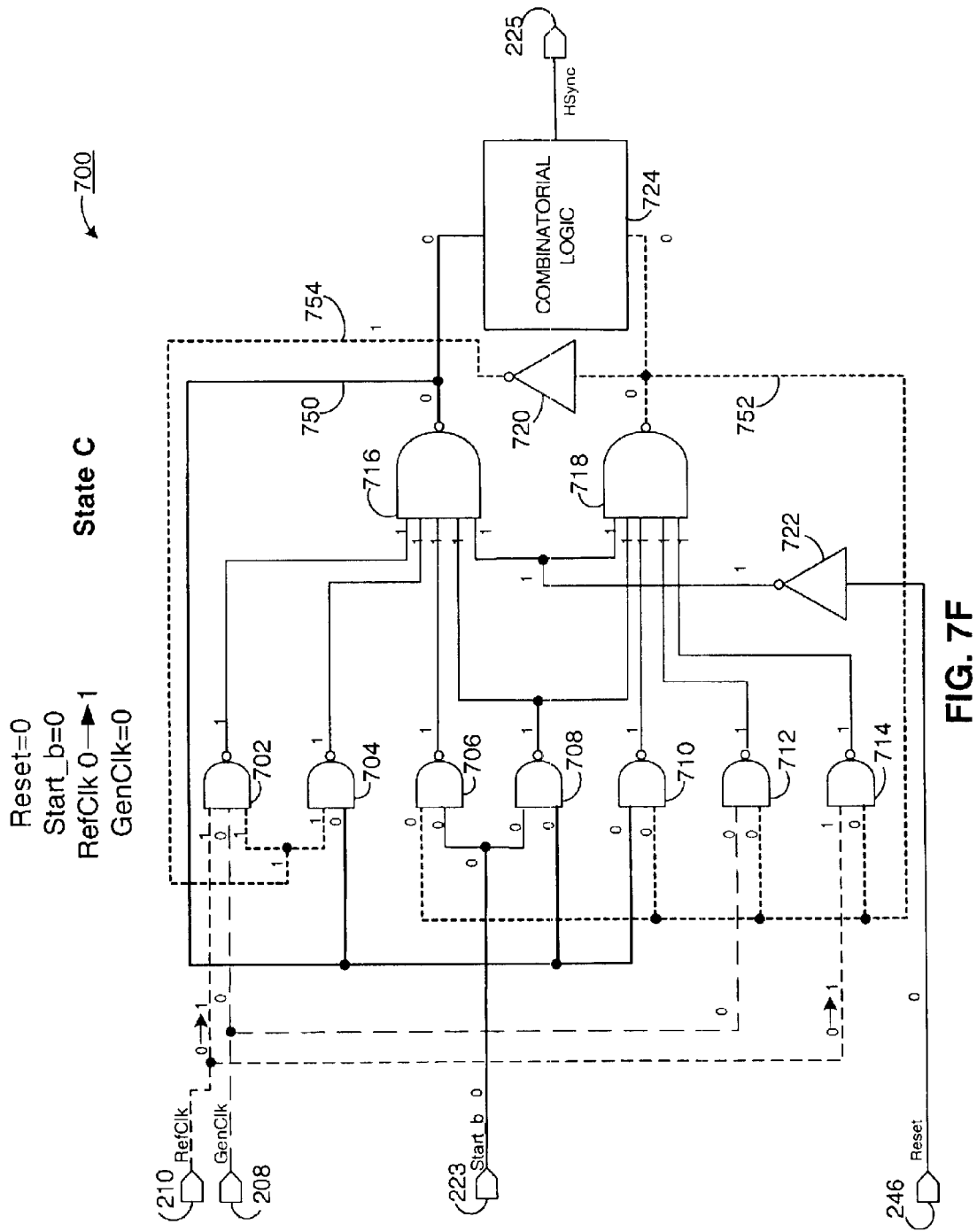

In FIG. 7F, RefClk again goes high, but this does not change the state of NAND gate 714 or NAND gate 702. So NAND gates 716 and 718 continue to output logic 0, and HSync remains active.

In FIG. 7G, GenClk also goes high, so NAND gate 712 outputs a logic 1, causing NAND gate 718 to output a logic 0, and causing combinatorial logic circuit 724 to no longer output an active HSync output signal on line 225.

Figure 7H:
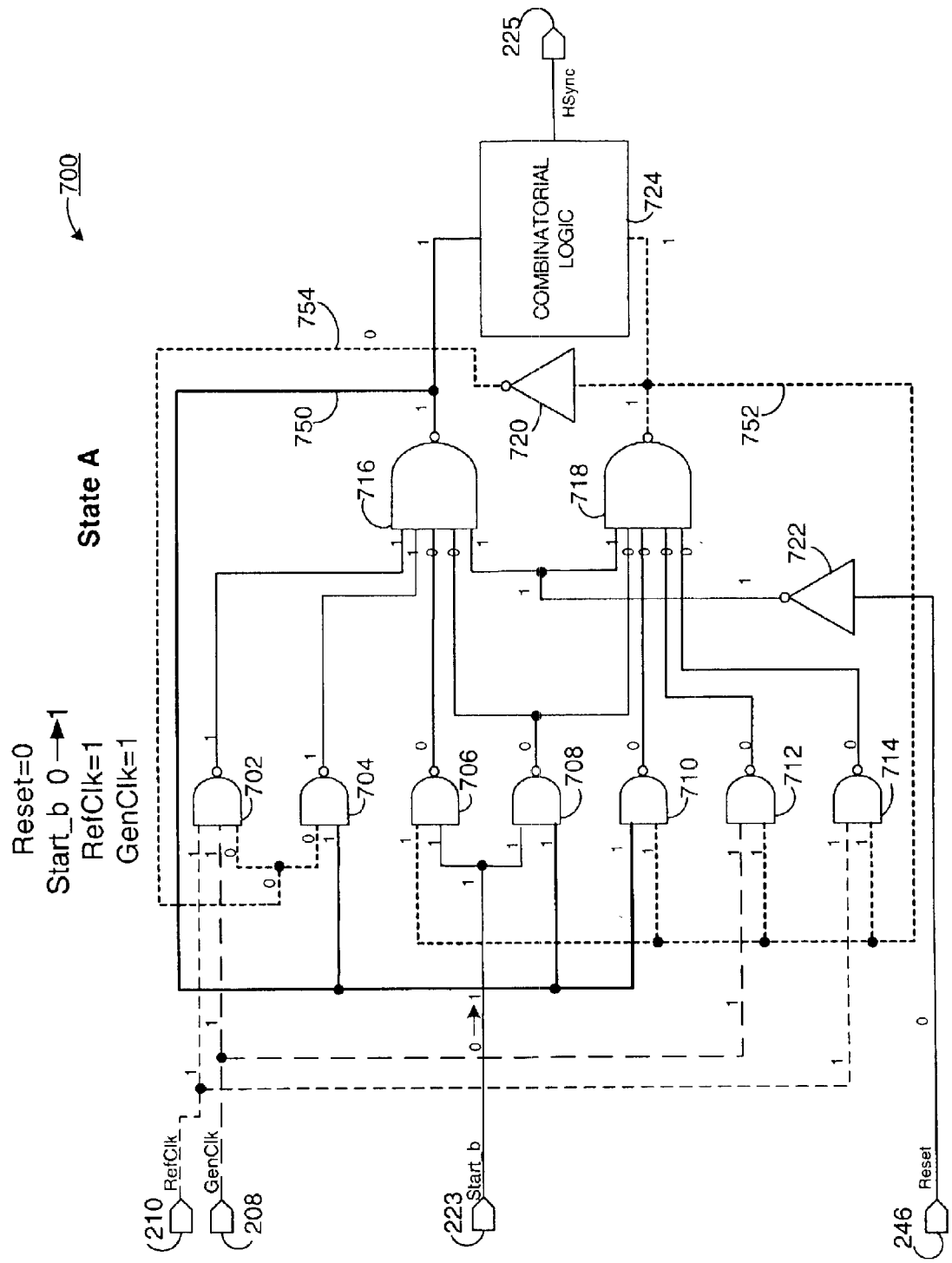

Finally, in FIG. 7H, Start_b goes high, causing both NAND gates 716 and 718 to output logic 1, returning the state machine to State A, ready for the next concurrence cycle.

The circuit of FIG. 7 is only one of many circuits that can implement the asynchronous state machine that accomplishes the invention. Any circuit that makes use of a start signal based on a counter, detects concurrence, and instructs another circuit to replace a generated clock signal with a reference clock signal can implement the invention. Many combinations of logic gates can accomplish this purpose, not just the NAND gate circuit shown in FIG. 7.

As shown in FIG. 4, the HSync output signal on line 225 is applied to combinational logic circuit 222. Combinational logic circuit 222 controls clock generator control circuit 228. Combinational logic circuit 222 provides two phase control signals to clock generator control circuit 228. One of them, phaseCtl[1] on line 235 is used only when clock generator 126 has not yet started to track the phase of the reference clock signal RefClk. However, the other phase control signal phaseCtl[0] on line 237 determines when hard phase alignment takes place. This signal is derived from the HSync signal on line 225 by combinational logic circuit 222. If external control signals on lines 205 indicate that the clock generator 126 should track the phase or is locked, then combinational logic circuit 222 passes the HSync signal as the PhaseCtl[0] signal on line 237. This causes clock generator control circuit 228 to substitute the edge of reference clock signal RefClk for that of the generated clock signal GenClk at the expected concurrence so hard phase alignment is achieved.

Figure 8:
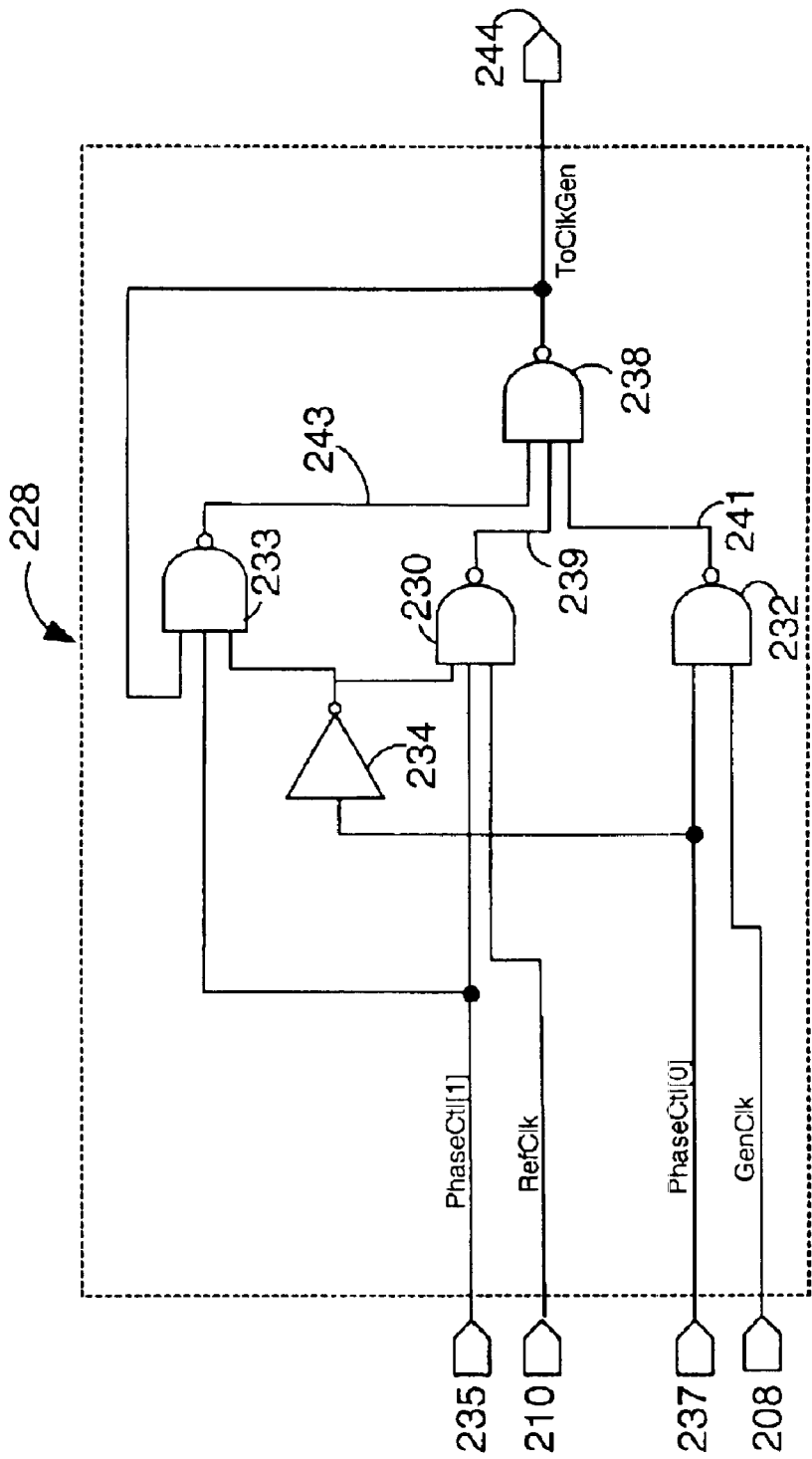
FIG. 8 shows a clock generator control circuit that can be used in the phase synchronizer circuit of FIG. 4.

FIG. 8 shows an embodiment of clock generator control circuit 228. It can be seen that when PhaseCtl[1] on line 235 is low, NAND gates 233 and 230 output logic 1 signals to NAND gate 238 so that NAND gate 238 simply inverts the signal from NAND gate 232. If PhaseCtl[0] on line 237 is low, then NAND gate 241 provides a high output signal and the output signal from clock generator control circuit 228 is low regardless of the state of the generated clock signal GenClk on line 208. Thus the clock generator 126 and phase alignment from phase synchronizer 201 (FIG. 3) are disabled.

Returning to FIG. 8, we may observe that after locking and phase tracking have started, PhaseCtl[1] on line 235 stays logic high, and the influence of RefClk and GenClk is determined by PhaseCtl[0].

When PhaseCtl[0] is low, RefClk will be selected as follows. NAND gate 232 outputs a logic high on line 241. Inverter 234 applies high input signals to NAND gates 230 and 233, enabling NAND gate 230. When a high RefClk causes the output of NAND gate 230 to go low, NAND gate 238 generates a high output signal on line 244. This high output signal is fed back to NAND gate 233. Thus, NAND gate 233 generates a low output signal, which duplicates the low output signal from NAND gate 230. When RefClk goes low (the end of concurrence), the high output signal from NAND gate 230 does not cause NAND gate 238 to switch because line 243 is still low. Thus only a single clock edge is generated by clock generator control circuit 228 in response to the high going RefClk signal following a low-going PhaseCtl[0] signal.

The effect of phase synchronizer 201 (FIG. 3) is thus to provide a hard phase alignment to the rising edge of the RefClk signal during the cycle at which concurrence is expected. The window of time during which hard phase alignment occurs depends on the jitter at the time and not on some pre-set or pre-programmed window estimate. Other circuits can achieve this one-time signal generation, as will be understood by those of ordinary skill in the art.

Phase detector 124 will now be described in detail.

Figure 9:
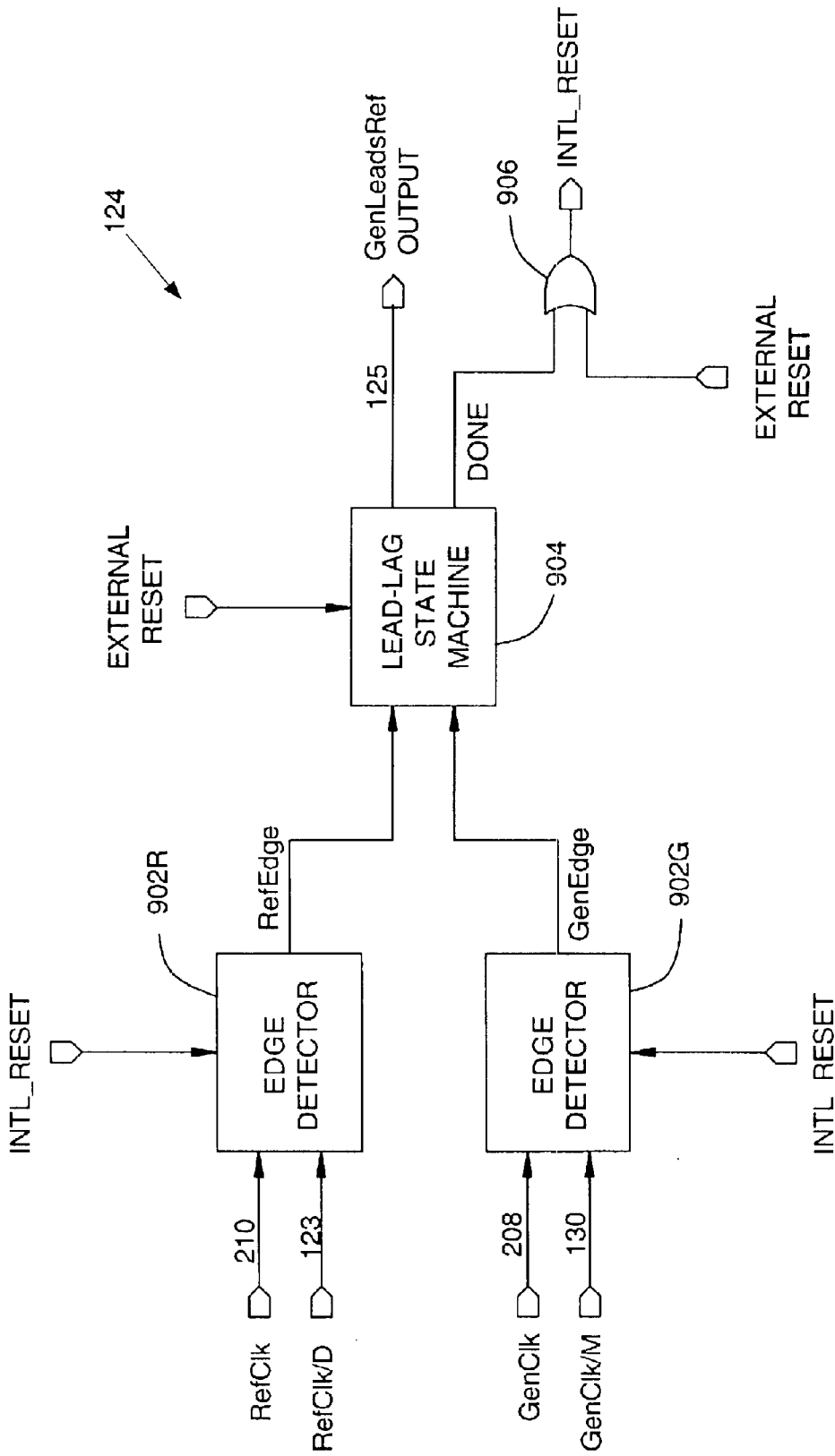
FIG. 9 shows a block diagram of phase detector 124 of FIG. 3.

FIG. 9 shows an overview of phase detector 124. Phase detector 124 includes edge detectors 902R and 902G (collectively edge detectors 902), and a lead-lag state machine 904. Phase detector 124 is responsive to clock signal RefClk, clock signal GenClk, a concurrence signal for the divided reference clock RefClk/D, and a concurrence signal for the divided generated clock GenClk/M. Phase detector 124 generates a control signal GenLeadsRef. When clock signal GenClk is leading clock signal RefClk, control signal GenLeadsRef is driven to the active state. Conversely, when clock signal GenClk is lagging clock signal RefClk, control signal GenLeadsRef is driven to the inactive state. Control signal GenLeadsRef may be used to guide clock generator 126 to produce clock signal GenClk having a frequency and phase such that clock signals GenClk and RefClk are synchronized at concurrences. Concurrence signals GenClk/M and RefClk/D act as gate signals to control the timing of phase comparisons between clock signals RefClk and GenClk, as described in more detail below.

Edge detector 902R generates an edge detection signal RefEdge, and edge detector 902G generates an edge detection signal GenEdge. When concurrence signal RefClk/D is in an active state, edge detector 902R drives edge detection signal RefEdge to the active state when the next edge of clock signal RefClk arrives. When concurrence signal GenClk/M is in the active state, edge detector 902G drives edge detection signal GenEdge to the active state when the next edge of GenClk arrives. In one embodiment, edge detectors 902 detect positive edges of the clock signals. Alternatively, edge detectors 902 may be configured to detect negative edges of the clock signals.

In one embodiment, edge detectors 902 are asynchronous level-mode sequential circuits. Edge detectors 902 asynchronously detect the next edge of their respective clock signals when their respective concurrence signals are in the active state. Thus, a level-change in a clock signal and/or a concurrence signal will cause a change in state of the edge detection signal and/or one or more internal signals in a given edge detector 902. An embodiment of operation of edge detectors 902 is described in detail below with respect to FIG. 9.

Lead-lag state machine 904 is responsive to edge detection signals RefEdge and GenEdge. Lead-lag state machine 904 incorporates asynchronous level-mode sequential circuitry. Responsive to edge detection signals RefEdge and GenEdge, lead-lag state machine 904 determines which of clock signals RefClk and GenClk is leading. If an edge of clock signal GenClk is detected first, lead-lag state machine 904 drives control signal GenLeadsRef to the active state. If an edge of input signal RetClk is detected first, lead-lag state machine 904 drives control signal GenLeadsRef to the inactive state.

After each phase comparison, lead-lag state machine 904 drives a reset signal INTL_RESET to an active state. Reset signal INTL_RESET is coupled to edge detectors 902R and 902G in order to reset edge detection signals RefEdge and GenEdge, respectively, to an inactive state. In one embodiment, an external reset signal is also coupled to lead-lag state machine 904. If the external reset signal is used, reset signal INTL_RESET is coupled to an OR gate 906 along with the external reset signal. If either reset signal INTL_RESET or the external reset signal is in the active state, edge detectors 902 will be reset. Operation of lead-lag state machine 904 is described below in more detail.

Phase detector 124 generates an output signal indicative of a phase difference between clock signals GenClk and RefClk at each concurrence. Phase detector 124 guides clock generator 126 such that clock signal GenClk is aligned with clock signal RefClk at each concurrence. In this manner, phase alignment between clock signal GenClk and RefClk is maintained.

In one embodiment, phase detector 124 only performs a phase comparison at concurrence. Concurrence signal RefClk/D is driven to an active state for the duration of the oscillatory period of input signal RefClk immediately before concurrence. Concurrence signal GenClk/M is driven to an active state for the duration of the oscillatory period of output signal GenClk immediately before concurrence is expected. Concurrence signals RefClk/D and GenClk/M are used to gate edge detectors 902.

Figure 10:
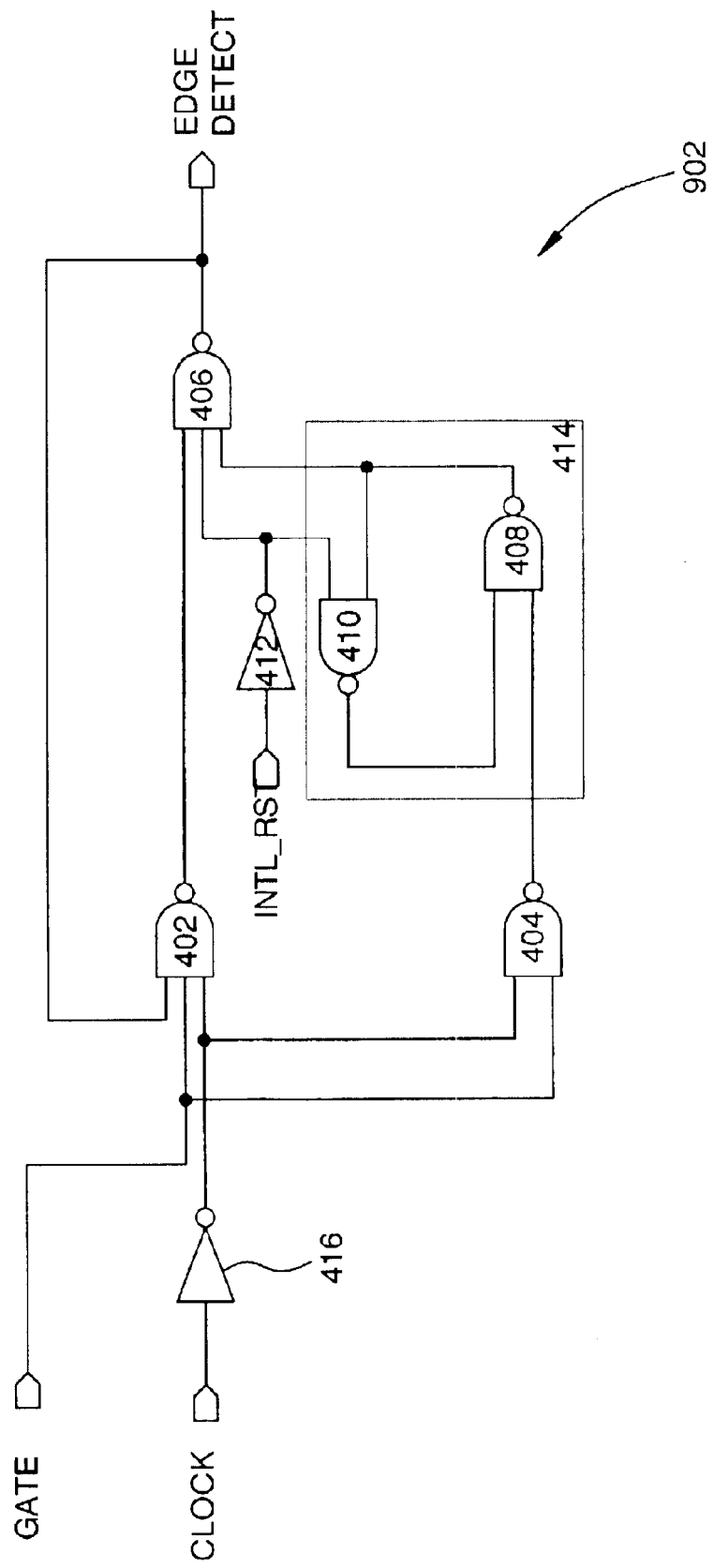
FIG. 10 shows an embodiment of edge detectors 902 of FIG. 9.

FIG. 10 shows an exemplary embodiment of edge detector 902. In one embodiment, edge detector 902 includes NAND gates 402 through 406, loop 414, and inverters 412 and 416. The loop 414 includes NAND gates 408 and 410. Edge detector 902 is responsive to gate, clock, and reset input signals. Edge detector 902 generates an edge detection output signal that indicates whether an edge in the clock input signal has arrived. In the present embodiment, the edge detection signal is an active low signal.

More specifically, the clock and reset signals are inverted by inverters 416 and 412, respectively. NAND gate 402 is responsive to the inverted clock signal, the gate signal, and the edge detection signal. NAND gate 404 is responsive to the inverted clock signal and the gate signal. NAND gate 408 is responsive to output from NAND gate 404 and output from NAND gate 410. NAND gate 410 is responsive to output from NAND gate 408 and the inverted reset signal. NAND gate 406 is responsive to output from NAND gate 402, the reset signal, and output from NAND gate 408.

In operation, the gate signal may be driven by one of concurrence signals GenClk/M and RefClk/D. The clock signal may be driven by either of clock signals GenClk and RefClk. The reset signal may be driven by reset signal INTL_RST. In an active low embodiment, the edge detection signal is initially in a logic high state and transitions to a logic low state when the gate signal is in the active state (logic high) and an edge of the clock signal arrives. When the gate signal is in the inactive state (logic low), the edge detection signal does not change in response to the clock signal. The intrinsic delay of loop 414 controls the minimum acceptable pulse width of the clock signal. Although edge detector 902 has been described as having NAND logic gates, those skilled in the art will appreciate that other combinations of logic gates can be used, such as AND gates.

Figure 1:
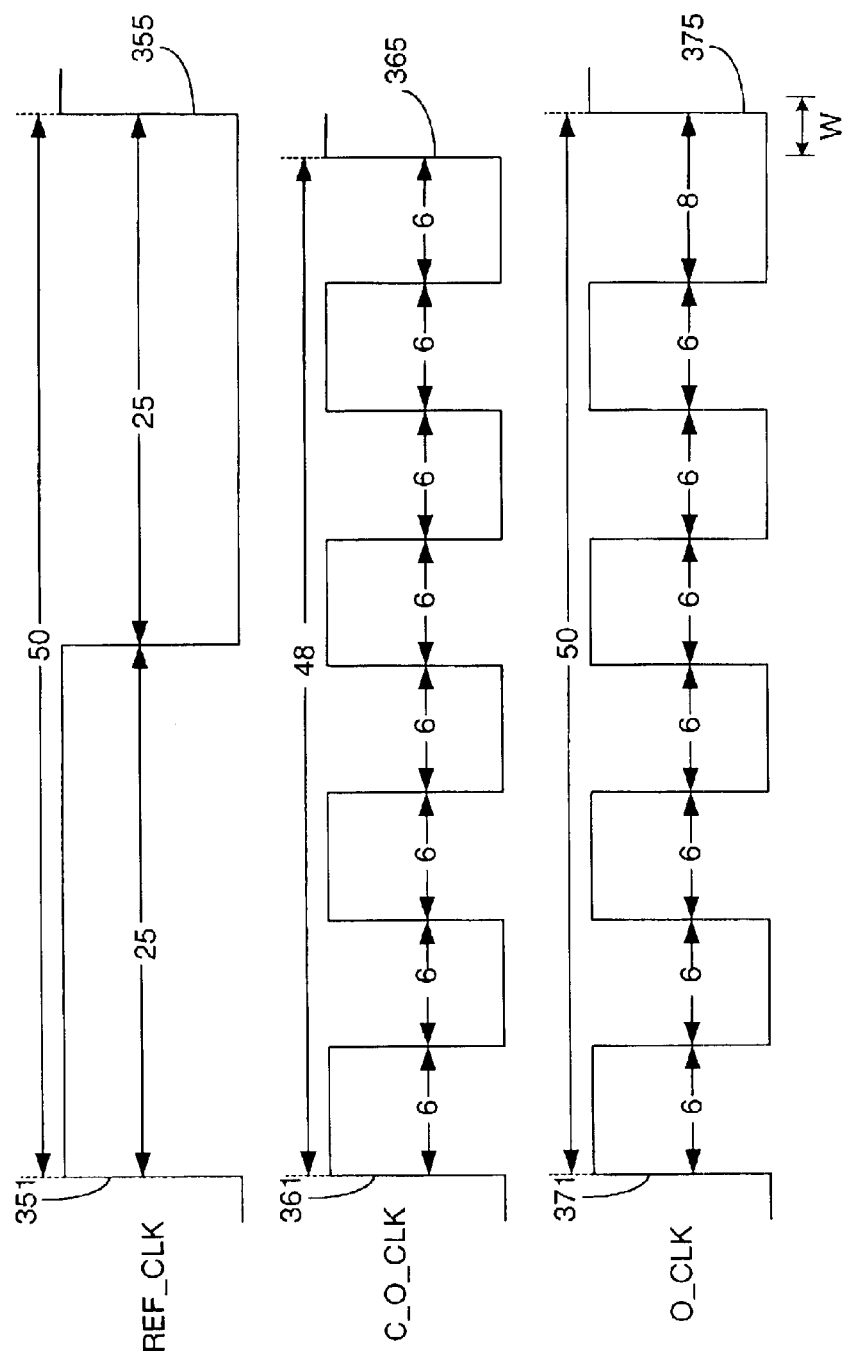
FIG. 1 shows a timing diagram of a prior art circuit in which a generated clock signal is brought into hard alignment with a reference clock signal during a pre-selected window.
Figure 11:
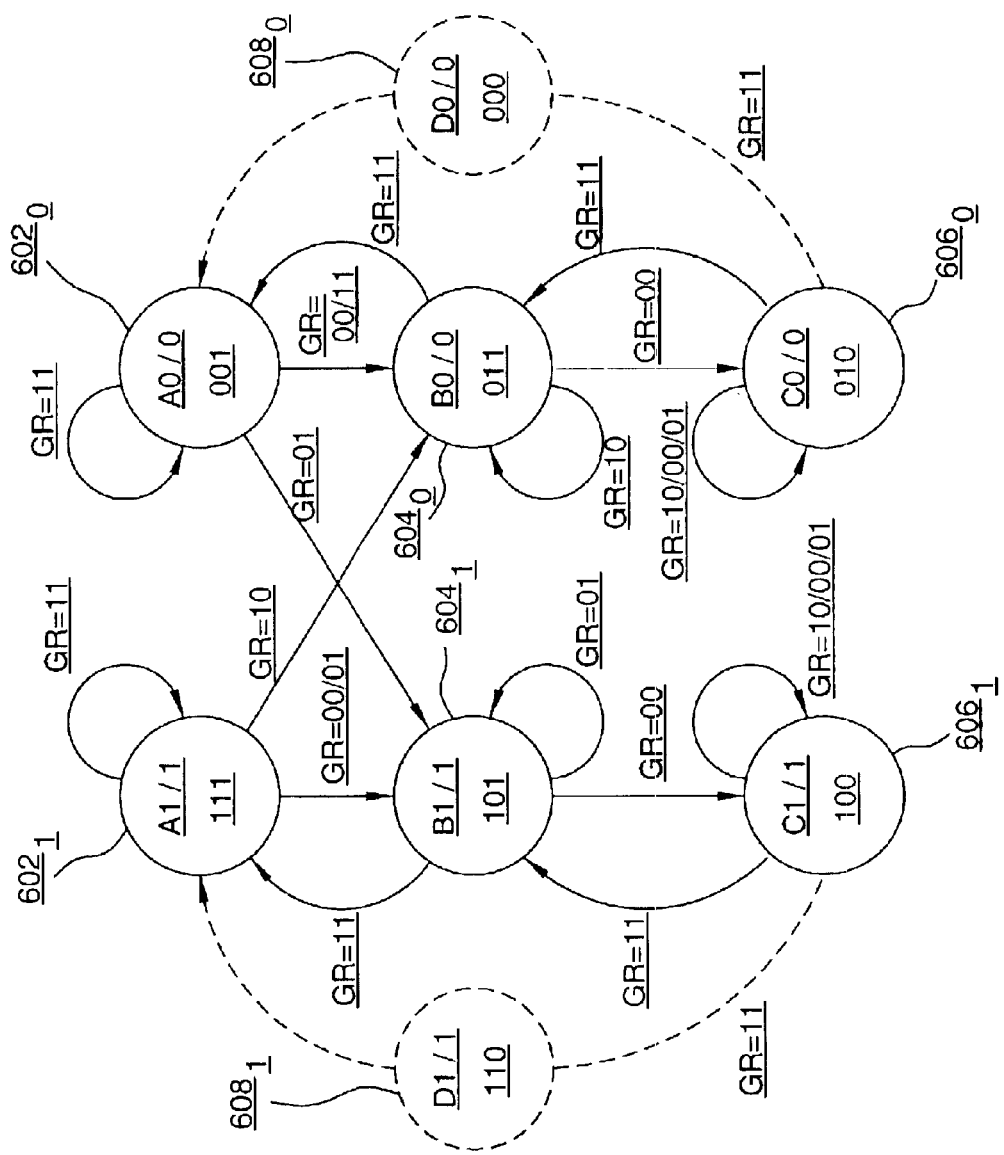
FIG. 11 shows a state diagram of state machine 904 of FIG. 9.

FIG. 11 depicts a state diagram showing an exemplary embodiment of operation of lead-lag state machine 904. In one embodiment, lead-lag state machine 904 is a Moore asynchronous level-mode state machine including initial states $602_0$ and $602_1$ (states A0 and A1, respectively), intermediate states $604_0$ and $604_1$ (states B0 and B1, respectively), and end states $606_0$ and $606_1$ (states C0 and C1, respectively). As is well known in the art, a Moore state machine provides outputs that depend only on the current state of the state machine, in contrast to a Mealy state machine in which the outputs depend on the inputs in addition to the current state of the state machine. Lead-lag state machine 904 is responsive to edge detection signal GenEdge (referred to in FIG. 11 as signal G) and edge detection signal RefEdge (referred to in FIG. 1 as signal R). In this embodiment, edge detection signals G and R are active low signals. Lead-lag state machine 904 generates output signals Y1, Y2, and Y3, at each of states 602, 604, and 606. When clock signal GenClk leads clock signal RefClk, output signal Y1 is active (high). When clock signal GenClk lags clock signal RefClk, output signal Y1 is inactive (low).

More specifically, state A0 is the initial state of lead-lag state machine 904 in a case where clock signal GenClk previously lagged clock signal RefClk. State A1 is the initial state of lead-lag state machine 904 in a case where clock signal GenClk previously led clock signal RefClk. Operation of lead-lag state machine 904 is now described starting from initial state A0.

If edge detection signals G and R are each high (OC=11), then lead-lag state machine 904 remains in state A0 and generates an output Y1, Y2, Y3 of 001. In state A0, no edges have been detected. When GR=01 (i.e., an edge is detected in clock signal GenClk), lead-lag state machine 904 transitions to state B1 and generates an output of 101. Output signal Y1 changes state, since clock signal GenClk now leads clock signal RefClk. If GR=00 (i.e., both edges have been detected at the same time) or GR=10 (i.e., an edge is detected in clock signal RefClk), lead-lag state machine 904 transitions to state B0 and generates an output of 011. Output signal Y1 remains in the same state, since clock signal GenClk still lags clock signal RefClk. Alternatively, if an edge is detected in both clock signals GenClk and RefClk (OC=00), the lead-lag state machine 904 may transition to state B1 instead of state B0.

Lead-lag state machine 904 remains in state B0 until an edge is detected in clock signal GenClk. That is, as long as GR=10, lead-lag state machine 904 remains in state B0. When GR=00, lead-lag state machine 904 transitions to state C0 and generates an output of 010. Output signal Y1 does not change state since clock signal GenClk still lags clock signal RefClk. At state C0, lead-lag state machine 904 changes the state of reset signal INTERNAL_RESET in order to reset the edge detectors 902. When edge detectors 902 are reset, GR=11 and lead-lag state machine 904 will transition from state C0, to state B0, and then to state A0. In another embodiment, lead-lag state machine 904 transitions to a transition state $608_0$ (state D0) and then to state A0. Operation of lead-lag state machine 904 when starting from initial state A1 is symmetrical with respect to operation, starting from initial state A0. Accordingly, lead-lag state machine 904 may include a transition state $608_1$ (state D1).

Figure 12:
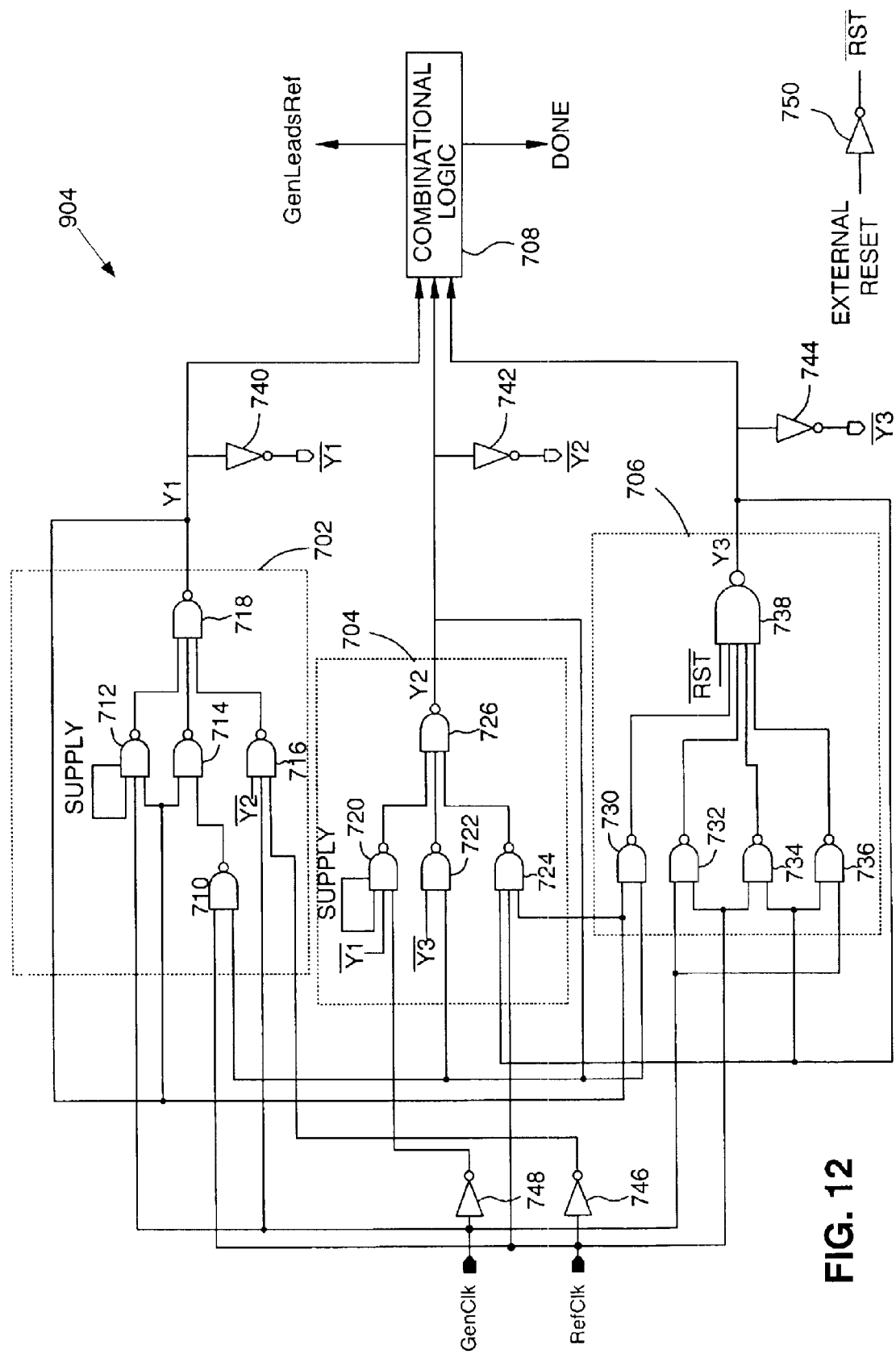
FIG. 12 shows a circuit that can implement the state diagram of FIG. 11.

FIG. 12 depicts a schematic diagram showing an exemplary embodiment of lead-lag state machine 904 in accordance with one or more aspects of the invention. Lead-lag state machine 904 comprises circuits 702, 704, and 706, as well as combinatorial logic 708. Circuit 702 generates output signal Y1; circuit 704 generates output signal Y2; and circuit 706 generates output signal Y3. Output signals Y1, Y2, and Y3 are coupled to combinatorial logic 708. Combinatorial logic 708 generates a signal DONE and control signal GenLeadsRef based on the logical values of Y1, Y2, and Y3 as described above. Inverters 740, 742, and 744 invert output signals Y1, Y2, and Y3, respectively. Inverters 746 and 748 invert clock signals RefClk and GenClk, respectively. Inverter 750 inverts the external reset signal to produce reset signal RST.

More specifically, circuit 702 includes NAND gates 710 through 718. NAND gate 710 is responsive to clock signal RefClk and output signal Y2. NAND gate 712 is responsive to a logic one signal from a supply source SUPPLY, clock signal GenClk, and output signal Y1. NAND gate 714 is responsive to output signal Y1 and the output from NAND gate 710. NAND gate 716 is responsive to clock signal GenClk, inverted clock signal RefClk, and inverted output signal Y2. NAND gate 718 is responsive to output from NAND gates 712, 714, and 716. NAND gate 718 generates output signal Y1.

Circuit 704 includes NAND gates 720 through 726. NAND gate 720 is responsive to the supply signal, inverted output signal Y1, and inverted clock signal GenClk. NAND gate 722 is responsive to output signal Y2 and inverted output signal Y3. NAND gate 724 is responsive to output signal Y3, clock signal RefClk, and output signal Y1. NAND gate 726 is responsive to output from NAND gates 720, 722, and 724. NAND gate 726 generates output signal Y2.

Circuit 706 includes NAND gates 730 through 738. NAND gate 730 is responsive to output signals Y1 and Y2. NAND gate 732 is responsive to clock signals GenClk and RefClk. NAND gate 734 is responsive to clock signal RefClk and output signal Y3. NAND gate 736 is responsive to output signal Y3 and clock signal GenClk. NAND gate 738 is responsive to output from NAND gates 730, 732, 734, and 736, as well as active low reset signal RST. NAND gate 738 generates output signal Y3.

Thus the circuit of FIG. 12 implements the state machine of FIG. 11. Other circuits can alternatively implement the state machine of FIG. 11, as would be understood by one of ordinary skill in the art.

Obvious variations derived from reading the above description are intended to be included in the scope of the invention, which is defined by the following claims. For example, although the above disclosure describes a single phase synchronizer with a single asynchronous level mode state machine for synchronizing phases of reference and clock signals, more than one phase synchronizer and more than one asynchronous level mode state machine may be used, and they may be used for aligning signals other than reference and generated clock signals.

What is claimed is:

1. A hard phase alignment control structure for a digital clock manager in an integrated circuit, comprising:

a reference clock signal;

a circuit for generating a generated clock signal based on the reference clock signal and an intended frequency ratio of the generated clock signal to the reference clock signal;

control circuitry coupled to receive the reference clock signal and the generated clock signal, the control circuitry configured to provide a reference concurrence signal indicating a first cycle count of the reference clock signal and a generated concurrence signal indicating a second cycle count of the generated clock signal; and a phase synchronizer containing at least one asynchronous level-mode state machine for aligning an edge of the generated clock signal to the reference clock signal when concurrence should occur.

2. The hard phase alignment control structure of claim 1, wherein the control circuitry comprises a first counter which counts cycles of the reference clock and a second counter which counts cycles of the generated clock signal.

3. The hard phase alignment control structure of claim 1, wherein the at least one asynchronous level-mode state machine comprises four states indicating:

normal clock signal generation, concurrence expected, concurrence exists and hard phase alignment is performed, and hard phase alignment has occurred and return to normal clock signal generation is awaited.

4. The hard phase alignment control structure of claim 3, wherein hard phase alignment begins when the reference and generated clock signals are at a first logic level and ends when the reference and generated clock signals are at a second logic level, and during hard phase alignment a clock edge is taken from the reference clock signal.

5. The hard phase alignment control structure of claim 1, wherein the phase synchronizer determines hard phase alignment based on the first and second cycle counts and on levels of the reference and generated clock signals.

6. An FPGA comprising:

a plurality of logic blocks;

a plurality of interconnect lines programmably interconnecting the logic blocks;

a frequency synthesizer receiving a reference clock signal and generating a generated clock signal at a frequency selected by a user, the generated clock signal being applied to at least one of the interconnect lines of the FPGA;

a phase synchronizer comprising at least one asynchronous level-mode state machine controlling the frequency synthesizer, wherein when the generated clock signal and the reference clock signal should have clock edges aligned and a reference clock signal edge is received, the asynchronous level-mode state machine causes the frequency synthesizer to apply the reference clock signal as the generated clock signal.

7. A circuit for aligning a generated clock signal with a reference clock signal comprising:

a divide-by-D circuit for receiving the reference clock signal and generating a divided version of the reference clock signal;

a divide-by-M circuit for receiving the generated clock signal and generating a divided version of the generated clock signal;

a phase detector for receiving the divided versions of the reference and generated clock signals and providing a phase detector signal indicating whether the generated clock signal is too fast or too slow;

a clock generator for generating the generated clock signal having a frequency M/D of the reference clock signal, the clock generator receiving the phase detector signal from the phase detector; and a phase synchronizer receiving the reference clock signal, the generated clock signal, and at least one concurrence signal, and providing a clock generator control signal when the at least one concurrence signal indicates concurrence should occur and both the reference and generated clock signals are at a predetermined state.

8. A method for aligning a generated clock signal with a reference clock signal comprising:

specifying a desired frequency ratio of the generated clock signal to the reference clock signal;

determining based on the ratio a time at which the generated clock signal and the reference clock signal should be in concurrence;

at a time before concurrence should occur, looking for concurrence at a first logic level;

when concurrence at the first logic level occurs, replacing the generated clock signal with the reference clock signal; and when concurrence at a second logic level occurs, ending the looking for concurrence.

9. The method of claim 8 wherein the ending the looking also includes ending the replacing.

10. The method of claim 8 wherein the determining is performed by counting cycles of the reference and clock signals and defining that concurrence occurs when the number of clock cycles of the generated clock signal is a numerator of the desired frequency ratio and the number of clock cycles of the reference clock signal is a denominator of the desired frequency ratio.

11. A method of aligning a generated clock signal with a reference clock signal comprising:

ascertaining if the generated and reference clock signals are expected to be concurrent;

when the generated and reference clock signals are expected to be concurrent, determining logic levels of the generated and reference clock signals;

waiting until the reference and generated clock signals are at a first level;

when the reference and generated clock signals are at the first level, asserting a hard phase alignment signal for replacing the generated clock signal with the reference clock signal;

waiting until the reference and generated clock signals are at a second level;

when the reference and generated clock signals are at the second level, returning to an initial state for ascertaining if the generated and reference clock signals are expected to be concurrent.

12. A method for synchronizing a generated clock signal with a reference clock signal comprising:

generating a start signal by counting cycles of the generated clock signal and the reference clock signal, wherein the start signal initiates detecting concurrence of the generated clock signal and the reference clock signal;

detecting concurrence of the generated clock signal and the reference clock signal; and when concurrence is detected, replacing an edge of the generated clock signal with an edge of the reference clock signal.

* * * * *